(12) United States Patent
Guo et al.

(10) Patent No.: US 12,340,751 B2
(45) Date of Patent: Jun. 24, 2025

(54) PIXEL DRIVING CIRCUIT AND DRIVING METHOD THEREOF, DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yonglin Guo, Beijing (CN); Cong Liu, Beijing (CN); Dan Cao, Beijing (CN); Tiaomei Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/269,550

(22) PCT Filed: Jun. 24, 2022

(86) PCT No.: PCT/CN2022/101323
§ 371 (c)(1),
(2) Date: Jun. 23, 2023

(87) PCT Pub. No.: WO2023/245676
PCT Pub. Date: Dec. 28, 2023

(65) Prior Publication Data
US 2025/0006132 A1   Jan. 2, 2025

(51) Int. Cl.
*G09G 3/3258*     (2016.01)
*H10K 59/121*    (2023.01)
(Continued)

(52) U.S. Cl.
CPC ....... *G09G 3/3258* (2013.01); *H10K 59/1213* (2023.02); *H10K 59/126* (2023.02);
(Continued)

(58) Field of Classification Search
CPC ......... G09G 3/3258; G09G 2300/0426; G09G 2300/0819; G09G 2300/0842;
(Continued)

(56) References Cited

U.S. PATENT DOCUMENTS 10,878,752 B1 * 12/2020 Li ........................ G09G 3/3225
11,011,113 B1 *  5/2021 Lu ........................ G09G 3/3225
(Continued)

FOREIGN PATENT DOCUMENTS

CN      110619849 A    12/2019
CN      111445848 A     7/2020
(Continued)

OTHER PUBLICATIONS

Written Opinion of PCT/CN2022/101323 dated Mar. 23, 2023 with English translation,(5p).

*Primary Examiner* — Ibrahim A Khan
(74) *Attorney, Agent, or Firm* — Arch & Lake LLP

(57) ABSTRACT

A pixel driving circuit includes: a driving circuit, connecting a first node, a second node, and a third node, and configured to provide a driving current to the third node by using the second node; a compensation circuit, connecting the third node, a fourth node, and a first gate driving signal end, and configured to conduct the third node and the fourth node; a first reset circuit, connecting a first initial signal end, a fifth node, and a first reset signal end, and configured to transmit a signal of the first initial signal end to the fifth node; a first isolation circuit, connecting the first node and the fourth node, and configured to conduct the first node and the fourth node; and a second isolation circuit, connecting the first node and the fifth node, and configured to conduct the first node and the fifth node.

20 Claims, 21 Drawing Sheets

(51) Int. Cl.
*H10K 59/126* (2023.01)
*H10K 59/131* (2023.01)

(52) U.S. Cl.
CPC ... *H10K 59/131* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/0214* (2013.01); *G09G 2320/045* (2013.01); *G09G 2330/06* (2013.01)

(58) Field of Classification Search
CPC ....... G09G 2300/0861; G09G 2310/08; G09G 2320/0214; G09G 2320/045; G09G 2330/06; H10K 59/1213; H10K 59/126; H10K 59/131
See application file for complete search history.

(56) References Cited

U.S. PATENT DOCUMENTS

| | | | | |
|---|---|---|---|---|
| 11,211,004 | B1* | 12/2021 | Kim | G09G 3/3233 |
| 11,355,064 | B2 | 6/2022 | Jeon et al. | |
| 11,410,599 | B2 | 8/2022 | Park et al. | |
| 11,410,607 | B2 | 8/2022 | Roh et al. | |
| 11,574,592 | B2 | 2/2023 | Kim et al. | |
| 2018/0151650 | A1* | 5/2018 | Ha | H10D 30/673 |
| 2018/0190191 | A1* | 7/2018 | Zhai | G09G 3/3233 |
| 2018/0247591 | A1* | 8/2018 | Kim | G09G 3/3233 |
| 2020/0402458 | A1* | 12/2020 | Gao | G09G 3/3233 |
| 2021/0057502 | A1* | 2/2021 | Kim | H10D 86/60 |
| 2021/0304672 | A1* | 9/2021 | Kim | G09G 3/3233 |
| 2021/0319747 | A1* | 10/2021 | Jeon | G09G 3/3233 |
| 2021/0375201 | A1* | 12/2021 | Park | G09G 3/3233 |
| 2021/0407414 | A1 | 12/2021 | Kim et al. | |
| 2022/0044635 | A1 | 2/2022 | Roh et al. | |
| 2022/0059031 | A1* | 2/2022 | Kim | G09G 3/3233 |
| 2022/0344424 | A1* | 10/2022 | Kim | H10D 86/423 |
| 2022/0383809 | A1 | 12/2022 | Park et al. | |
| 2022/0398978 | A1* | 12/2022 | Kim | G09G 3/3291 |
| 2023/0026562 | A1* | 1/2023 | Kim | H10K 59/1213 |
| 2023/0048014 | A1 | 2/2023 | Wang et al. | |
| 2023/0380217 | A1* | 11/2023 | Lu | H10K 59/1216 |
| 2024/0038156 | A1* | 2/2024 | Zhang | H10K 59/123 |
| 2024/0161692 | A1* | 5/2024 | Lu | G09G 3/3258 |
| 2024/0334770 | A1* | 10/2024 | Chen | H10K 59/131 |

FOREIGN PATENT DOCUMENTS

| | | |
|---|---|---|
| CN | 111613177 A | 9/2020 |
| CN | 112397028 A | 2/2021 |
| CN | 112447140 A | 3/2021 |
| CN | 212724668 U | 3/2021 |
| CN | 112639951 A | 4/2021 |
| CN | 113192460 A | 7/2021 |
| CN | 113362758 A | 9/2021 |
| CN | 113763887 A | 12/2021 |
| CN | 113781955 A | 12/2021 |
| CN | 113838424 A | 12/2021 |
| CN | 113851085 A | 12/2021 |
| CN | 113963667 A | 1/2022 |
| CN | 114067748 A | 2/2022 |
| CN | 114093914 A | 2/2022 |
| CN | 114122101 A | 3/2022 |
| CN | 114170959 A | 3/2022 |

* cited by examiner

PIXEL DRIVING CIRCUIT AND DRIVING METHOD THEREOF, DISPLAY PANEL AND DISPLAY DEVICE

CROSS-REFERENCE TO RELATED APPLICATIONS

The present application is the U.S. National Stage of International Application No. PCT/CN2022/101323, filed on Jun. 24, 2022, the contents of which are incorporated herein by reference in their entireties for all purposes.

TECHNICAL FIELD

The present disclosure relates to the field of display technology, in particular to a pixel driving circuit and driving method thereof, display panel and display device.

BACKGROUND

In related arts, a pixel driving circuit includes a driving transistor, and the driving transistor provides a driving current to its drain based on its gate source voltage difference. However, due to the problem of electricity leakage from the gate of the driving transistor to other nodes, the driving current provided by the driving transistor is unstable.

It should be noted that the information disclosed in the background section above is intended only to enhance the understanding of the background of the present disclosure and therefore may include information that does not constitute prior art known to those ordinary skilled in the art.

SUMMARY

According to one aspect of the present disclosure, a pixel driving circuit is provided, and the pixel driving circuit includes: a driving circuit, a compensation circuit, a first reset circuit, a first isolation circuit, and a second isolation circuit. The driving circuit connects a first node, a second node, and a third node, and configured to provide, based on a voltage of the first node, a driving current to the third node by using the second node; the compensation circuit connects the third node, a fourth node, and a first gate driving signal end, and configured to conduct the third node and the fourth node in response to a signal of the first gate driving signal end; the first reset circuit connects a first initial signal end, a fifth node, and a first reset signal end, and configured to transmit a signal of the first initial signal end to the fifth node in response to a signal of the first reset signal end; the first isolation circuit connects the first node and the fourth node, and configured to conduct the first node and the fourth node in response to a control signal; and the second isolation circuit connects the first node and the fifth node, and configured to conduct the first node and the fifth node in response to a control signal.

In one embodiment of the present disclosure, the fourth node is connected to the fifth node.

In one embodiment of the present disclosure, the driving circuit includes: a driving transistor, having a first terminal connected to the second node, a second terminal connected to the third node, and a gate connected to the first node; the compensation circuit includes: a second transistor, having a first terminal connected to the fourth node, a second terminal connected to the third node, and a gate connected to the first gate driving signal end; the first reset circuit includes: a first transistor, having a first terminal connected to the first initial signal end, a second terminal connected to the fifth node, and a gate connected to the first reset signal end; the first isolation circuit includes: a ninth transistor, having a first terminal connected to the first node and a second terminal connected to the fourth node; and the second isolation circuit includes: an eighth transistor, having a first terminal connected to the first node and a second terminal connected to the fifth node.

In one embodiment of the present disclosure, any one of the first transistor, the second transistor, the eighth transistor, and the ninth transistor is an N-type transistor or a P-type transistor.

In one embodiment of the present disclosure, the pixel driving circuit is configured to drive a light emitting unit to emit light, and the pixel driving circuit further includes: a light emitting control circuit, a second reset circuit, a data writing circuit, and a storage circuit. The light emitting control circuit connects a first power supply end, the second node, the third node, an enable signal end, and a first electrode of the light emitting unit, and the light emitting control circuit is configured to connect the first power supply end and the second node and connect the third node and the first electrode of the light emitting unit in response to a signal of the enable signal end; the second reset circuit connects the first electrode of the light emitting unit, a second initial signal end, and a second reset signal end, and the second reset circuit is configured to transmit a signal of the second initial signal end to the first electrode of the light emitting unit in response to a signal of the second reset signal end; the data writing circuit connects the second node, a data signal end, and a second gate driving signal end, and the data writing circuit is configured to transmit a signal of the data signal end to the second node in response to a signal of the second gate driving signal end; and the storage circuit is connected between the first node and the first power supply end.

In one embodiment of the present disclosure, the data writing circuit includes: a fourth transistor, having a first terminal connected to the data signal end, a second terminal connected to the second node, and a gate connected to the second gate driving signal end; the light emitting control circuit includes a fifth transistor and a sixth transistor, where the fifth transistor has a first terminal connected to the first power supply end, a second terminal connected to the second node, and a gate connected to the enable signal end; the sixth transistor has a first terminal connected to the third node, a second terminal connected to the first electrode of the light emitting unit, and a gate connected to the enable signal end; the second reset circuit includes: a seventh transistor, having a first terminal connected to the second initial signal end, a second terminal connected to the first electrode of the light emitting unit, and a gate connected to the second reset signal end; and the storage circuit includes a capacitor, having a first electrode connected to the first node and a second electrode connected to the first power supply end.

In one embodiment of the present disclosure, the first isolation circuit and the data writing circuit have a same conduction level logic, the first isolation circuit is connected to the second gate driving signal end, and the first isolation circuit is configured to conduct the first node and the fourth node in response to the signal of the second gate driving signal end.

According to one aspect of the present disclosure, a driving method for a pixel driving circuit is provided. The method is used for driving the pixel driving circuit described above and includes:

in a reset phase, transmitting the signal of the first initial signal end to the fifth node by using the first reset circuit, and conducting the fifth node and the first node by using the second isolation circuit;

in a data writing phase, conducting the fourth node and the third node by using the compensation circuit, and conducting the fourth node and the first node by using the first isolation circuit; and in a light emitting phase, disconnecting the first initial signal end and the fifth node by using the first reset circuit, disconnecting the fifth node and the first node by using the second isolation circuit, disconnecting the fourth node and the third node by using the compensation circuit, and disconnecting the fourth node and the first node by using the first isolation circuit.

According to one aspect of the present disclosure, a display panel is provided, and the display panel includes the pixel driving circuit described above.

According to one aspect of the present disclosure, a display panel is provided. The display panel includes a pixel driving circuit, and the pixel driving circuit includes: a driving transistor, an eighth transistor, a ninth transistor, a first transistor, and a second transistor. The eighth transistor has a first terminal connected to a gate of the driving transistor and a gate connected to a third reset signal line; the ninth transistor has a first terminal connected to the gate of the driving transistor and a gate connected to a second gate line; the first transistor has a first terminal connected to a first initial signal line, a second terminal connected to a second terminal of the eighth transistor, and a gate connected to a first reset signal line; the second transistor has a first terminal connected to a second terminal of the ninth transistor, a second terminal connected to a second terminal of the driving transistor, and a gate connected to a first gate line. The display panel further includes: a substrate, a first active layer, a first conductive layer, a second active layer, and a third conductive layer. The first active layer includes a third active portion, an eighth active portion, and a ninth active portion, where the third active portion is used for forming a channel region of the driving transistor, the eighth active portion is used for forming a channel region of the eighth transistor, and the ninth active portion is used for forming a channel region of the ninth transistor; the first conductive layer is located at a side of the first active layer away from the substrate, the first conductive layer includes: the third reset signal line, the second gate line, and a first conductive portion, where an orthographic projection of the third reset signal line on the substrate covers an orthographic projection of the eighth active portion on the substrate, a partial structure of the third reset signal line is used for forming the gate of the eighth transistor, an orthographic projection of the second gate line on the substrate covers an orthographic projection of the ninth active portion on the substrate, a partial structure of the second gate line is used for forming the gate of the ninth transistor, an orthographic projection of the first conductive portion on the substrate covers an orthographic projection of the third active portion on the substrate, and the first conductive portion is used for forming the gate of the driving transistor; the second active layer is located at a side of the first conductive layer away from the substrate, the second active layer includes a first active portion and a second active portion, where the first active portion is used for forming a channel region of the first transistor, and the second active portion is used for forming a channel region of the second transistor; and the third conductive layer is located at a side of the second active layer away from the substrate, the third conductive layer includes the first reset signal line and the first gate line, where an orthographic projection of the first reset signal line on the substrate covers an orthographic projection of the first active portion on the substrate, a partial structure of the first reset signal line is used for forming a top gate of the first transistor, an orthographic projection of the first gate line on the substrate covers an orthographic projection of the second active portion on the substrate, and a partial structure of the first gate line is used for forming a top gate of the second transistor.

In one embodiment of the present disclosure, the orthographic projection of the third reset signal line on the substrate, the orthographic projection of the second gate line on the substrate, the orthographic projection of the first reset signal line on the substrate, and the orthographic projection of the first gate line on the substrate extend along a first direction; the orthographic projection of the first gate line on the substrate is located between the orthographic projection of the first conductive portion on the substrate and the orthographic projection of the second gate line on the substrate; and the orthographic projection of the third reset signal line on the substrate is located at a side of the orthographic projection of the second gate line on the substrate away from the orthographic projection of the first conductive portion on the substrate; and the orthographic projection of the first reset signal line on the substrate is located at a side of the orthographic projection of the third reset signal line on the substrate away from the orthographic projection of the first conductive portion on the substrate.

In one embodiment of the present disclosure, the display panel further includes a light emitting unit, where the pixel driving circuit further includes a fifth transistor and a seventh transistor; where a first terminal of the fifth transistor is connected to a power supply line, a second terminal of the fifth transistor is connected to a first terminal of the driving transistor, a first terminal of the seventh transistor is connected to a second initial signal line, and a second terminal of the seventh transistor is connected to a first electrode of the light emitting unit. The first active layer further includes a fifth active portion and a seventh active portion, where the fifth active portion is used for forming a channel region of the fifth transistor; and the seventh active portion is used for forming a channel region of the seventh transistor. The first conductive layer further includes: an enable signal line and a second reset signal line, where an orthographic projection of the enable signal line on the substrate extends along the first direction and covers an orthographic projection of the fifth active portion on the substrate, and a partial structure of the enable signal line is used for forming a gate of the fifth transistor; and an orthographic projection of the second reset signal line on the substrate extends along the first direction and covers an orthographic projection of the seventh active portion on the substrate, and a partial structure of the second reset signal line is used for forming a gate of the seventh transistor; where the orthographic projection of the enable signal line on the substrate is located at a side of the orthographic projection of the first conductive portion on the substrate away from the orthographic projection of the first gate line on the substrate; and the orthographic projection of the second reset signal line on the substrate is located at a side of the orthographic projection of the enable signal line on the substrate away from the orthographic projection of the first conductive portion on the substrate.

In one embodiment of the present disclosure, the display panel includes a plurality of pixel driving circuits distributed in an array along a row direction and a column direction, where the first direction is the row direction, and the second reset signal line in the pixel driving circuits of one row is multiplexed as the third reset signal line in the pixel driving circuits of one adjacent next row.

In one embodiment of the present disclosure, the display panel includes a plurality of pixel driving circuits distributed in an array along a row direction and a column direction, where the first direction is the row direction, and the orthographic projection of the first reset signal line, in the pixel driving circuits of one adjacent next row, on the substrate, is located between the orthographic projection of the second reset signal line, in the pixel driving circuits of one row, on the substrate, and the orthographic projection of the enable signal line, in the pixel driving circuits of this row, on the substrate.

In one embodiment of the present disclosure, the display panel further includes a fourth conductive layer, located at a side of the third conductive layer away from the substrate, where the fourth conductive layer includes the second initial signal line, an orthographic projection of the second initial signal line extends along a second direction on the substrate, and the second direction intersects with the first direction.

In one embodiment of the present disclosure, the pixel driving circuit further includes a fourth transistor, where a first terminal of the fourth transistor is connected to a data line, a second terminal of the fourth transistor is connected to the first terminal of the driving transistor; and the display panel further includes: a fifth conductive layer, located at a side of the fourth conductive layer away from the substrate, where the fifth conductive layer includes the data line and the power supply line, and an orthographic projection of the data line on the substrate and an orthographic projection of the power supply line on the substrate extend along the second direction; the display panel further includes a plurality of repeating cells distributed in an array along the first direction and the second direction, where each repeating cell includes two pixel driving circuits distributed along the first direction, and two pixel driving circuits in the same repeating cell are arranged in mirror symmetry; where the second direction is the column direction, and each column of the pixel driving circuits is provided with one power supply line and one data line correspondingly; and in two pixel driving circuits adjacent to each other in the first direction and located in different repeating cells, orthographic projections of two data lines on the substrate are located between orthographic projections of two power supply lines on the substrate, and the orthographic projection of the second initial signal line on the substrate is located between the orthographic projections of the two data lines on the substrate.

In one embodiment of the present disclosure, two pixel driving circuits adjacent to each other in the first direction and located in different repeating cells are provided with one second initial signal line correspondingly, and the second initial signal line is connected to the first terminal of the seventh transistor in each of the corresponding two pixel driving circuits, respectively.

In one embodiment of the present disclosure, the display panel includes a plurality of repeating cells distributed in an array along a first direction and a second direction, where the first direction intersects with the second direction; each repeating cell includes two pixel driving circuits distributed along the first direction, and two pixel driving circuits in the same repeating cell are arranged in mirror symmetry; the pixel driving circuit further includes a capacitor, where a first electrode of the capacitor is connected to the gate of the driving transistor, and a second electrode of the capacitor is connected to a power supply line; and the first direction is a row direction, the second direction is a column direction, and the display panel further includes a second conductive layer and a fifth conductive layer, where the second conductive layer is located between the first conductive layer and the second active layer, the second conductive layer includes a second conductive portion, an orthographic projection of the second conductive portion on the substrate and the orthographic projection of the first conductive portion on the substrate at least partially overlap, the first conductive portion is multiplexed as the first electrode of the capacitor, and the second conductive portion is used for forming the second electrode of the capacitor; and the fifth conductive layer is located at a side of the third conductive layer away from the substrate, and the fifth conductive layer includes the power supply line, where each column of the pixel driving circuits is provided with one power supply line correspondingly, and the power supply line includes: a first extension portion, a second extension portion, and a third extension portion, where the second extension portion is connected between the first extension portion and the third extension portion; where an orthographic projection of the second extension portion on the substrate has a larger size in the row direction than an orthographic projection of the first extension portion on the substrate, and the orthographic projection of the second extension portion on the substrate has a larger size in the row direction than an orthographic projection of the third extension portion on the substrate; and second extension portions in two adjacent power supply lines in the same repeating cell are connected to each other, and two adjacent second conductive portions in two repeating cells adjacent to each other in the row direction are connected to each other.

In one embodiment of the present disclosure, the display panel further includes a light emitting unit, where the pixel driving circuit further includes: a fourth transistor, a fifth transistor, a sixth transistor, a seventh transistor, and a capacitor; where a first terminal of the fourth transistor is connected to a data line, and a second terminal of the fourth transistor is connected to a first terminal of the driving transistor; a first terminal of the fifth transistor is connected to a power supply line, and a second terminal of the fifth transistor is connected to the first terminal of the driving transistor; a first terminal of the sixth transistor is connected to the second terminal of the driving transistor, and a second terminal of the sixth transistor is connected to a first electrode of the light emitting unit; a first terminal of the seventh transistor is connected to a second initial signal line, and a second terminal of the seventh transistor is connected to the first electrode of the light emitting unit; a first electrode of the capacitor is connected to the gate of the driving transistor, and a second electrode of the capacitor is connected to the power supply line; and the first transistor and the second transistor are N-type transistors, and the driving transistor, the fourth transistor, the fifth transistor, the sixth transistor, the seventh transistor, the eighth transistor, and the ninth transistor are P-type transistors.

According to one aspect of the present disclosure, a display device is provided, and the display device includes the display panel described above.

It should be understood that the general description above and the later detailed description are only illustrative and explanatory, and do not limit the present disclosure.

BRIEF DESCRIPTION OF THE DRAWINGS

The accompanying drawings herein are incorporated into the specification and form a part of the specification, illustrating embodiments in accordance with the present disclosure, and are used in conjunction with the specification to explain the principles of the present disclosure. Obviously, the accompanying drawings in the following description are only some embodiments of the present disclosure. For those ordinary skilled in the art, other accompanying drawings may be obtained based on these accompanying drawings without any creative labor.

DETAILED DESCRIPTION

Figure 1:
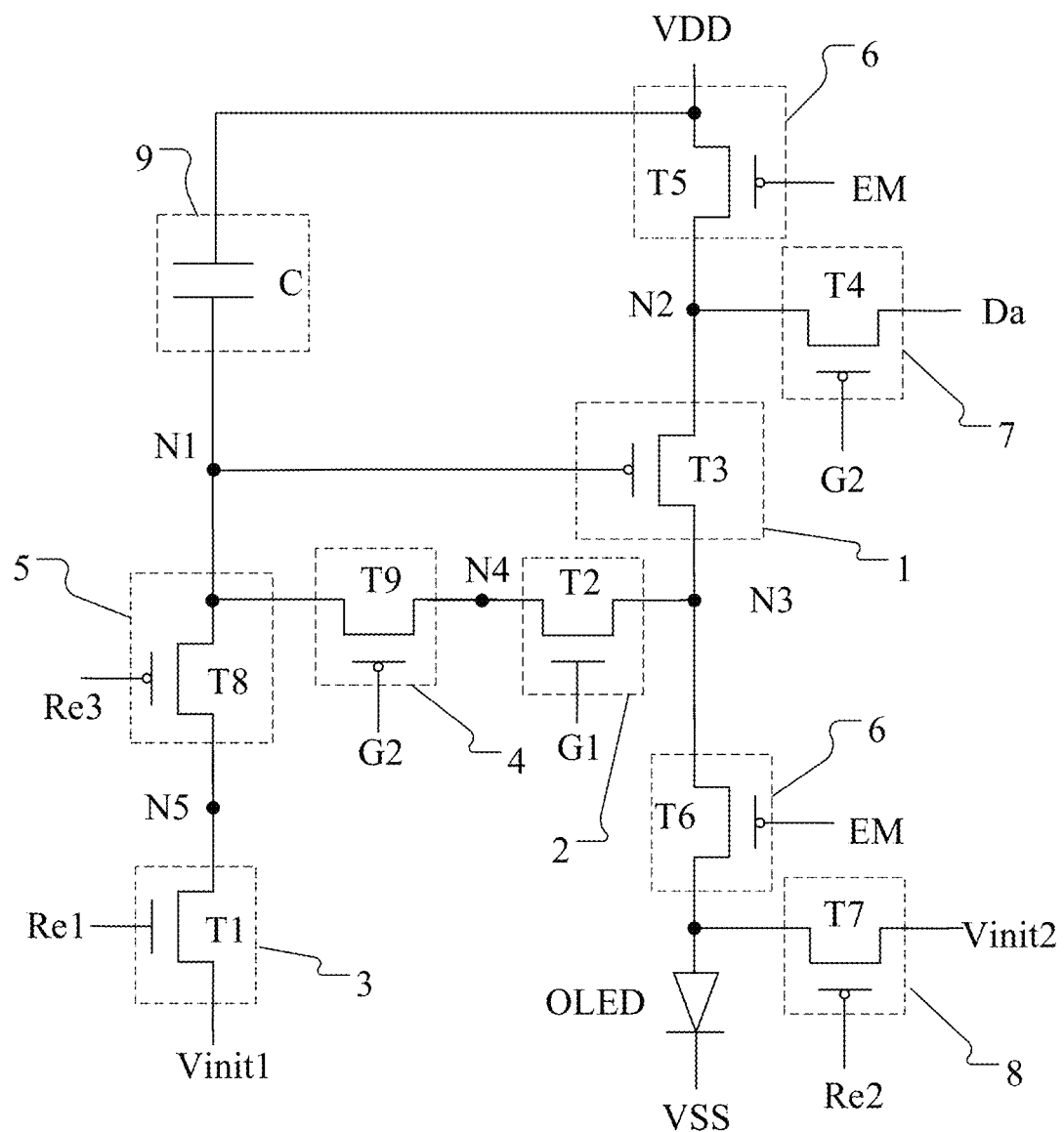
FIG. 1 is a schematic structure diagram of a pixel driving circuit of one embodiment of the present disclosure.

Embodiments will now be described more comprehensively with reference to the accompanying drawings. However, the embodiments may be implemented in multiple forms and should not be limited to the examples set forth herein. On the contrary, providing these embodiments makes the present disclosure more comprehensive and complete, and comprehensively conveys the concept of the embodiments to those skilled in the art. The same reference numerals in the drawings represent the same or similar structures, therefore their detailed descriptions will be omitted.

The terms "a", "an", "the" are used to indicate the existence of one or more elements/components/etc. The terms "include" and "have" are used to indicate open inclusion and refer to the existence of additional elements/components/etc. in addition to the listed elements/components/etc.

As shown in FIG. 1, a schematic structure diagram of a pixel driving circuit of one embodiment of the present disclosure is shown. The pixel driving circuit may include: a driving circuit 1, a compensation circuit 2, a first reset circuit 3, a first isolation circuit 4, and a second isolation circuit 5. The driving circuit 1 connects a first node N1, a second node N2, and a third node N3, and configured to provide, based on a voltage difference between the first node N1 and the second node N2, a driving current to the third node N3; the compensation circuit 2 connects the third node N3, a fourth node N4, and a first gate driving signal end G1, and configured to conduct the third node N3 and the fourth node N4 in response to a signal of the first gate driving signal end G1; the first reset circuit 3 connects a first initial signal end Vinit1, a fifth node N5, and a first reset signal end Re1, and configured to transmit a signal of the first initial signal end Vinit1 to the fifth node N5 in response to a signal of the first reset signal end Re1; the first isolation circuit 4 connects the first node N1 and the fourth node N4, and configured to conduct the first node N1 and the fourth node N4 in response to a control signal; the second isolation circuit 5 connects the first node N1 and the fifth node N5, and configured to conduct the first node N1 and the fifth node N5 in response to a control signal.

In this embodiment, during a light emitting phase, the compensation circuit 2, the first reset circuit 3, the first isolation circuit 4, and the second isolation circuit 5 are turned off, and the driving circuit 1 may provide, based on a voltage of the first node N1, the driving current to the third node by using the second node N2. This embodiment can reduce the leakage current from the first node N1 to the first initial signal end Vinit1 and the third node N3 by adding the first isolation circuit 4 and the second isolation circuit 5, and thus can improve the stability of the pixel driving circuit during the light emitting phase.

As shown in FIG. 1, the pixel driving circuit may be configured to drive a light emitting unit OLED to emit light, and the pixel driving circuit may further include: a light emitting control circuit 6, a data writing circuit 7, a second reset circuit 8, and a storage circuit 9. The light emitting control circuit 6 connects a first power supply end VDD, the second node N2, the third node N3, an enable signal end EM, and a first electrode of the light emitting unit OLED. The light emitting control circuit 6 is configured to connect the first power supply end VDD and the second node N2 and connect the third node N3 and the first electrode of the light emitting unit OLED in response to a signal of the enable signal end EM. A second electrode of the light emitting unit OLED may be connected to a second power supply end VSS. The second reset circuit 8 connects the first electrode of the light emitting unit OLED, a second initial signal end Vinit2, and a second reset signal end Re2, and the second reset circuit 8 is configured to transmit a signal of the second initial signal end Vinit2 to the first electrode of the light emitting unit OLED in response to a signal of the second reset signal end Re2. The data writing circuit 7 connects the second node N2, a data signal end Da, and a second gate driving signal end G2, and the data writing circuit 7 is configured to transmit a signal of the data signal end Da to the second node N2 in response to a signal of the second gate driving signal end G2. The storage circuit 9 is connected between the first node N1 and the first power supply end VDD.

As shown in FIG. 1, the driving circuit 1 may include a driving transistor T3, a first terminal of the driving transistor T3 is connected to the second node N2, a second terminal of the driving transistor T3 is connected to the third node N3, and a gate of the driving transistor T3 is connected to the first node N1. The compensation circuit 2 may include a second transistor T2, a first terminal of the second transistor T2 is connected to the fourth node N4, a second terminal of the second transistor T2 is connected to the third node N3, and a gate of the second transistor T2 is connected to the first gate driving signal end G1. The first reset circuit 3 includes a first transistor T1, a first terminal of the first transistor T1 is connected to the first initial signal end Vinit1, a second terminal of the first transistor T1 is connected to the fifth node N5, and a gate of the first transistor T1 is connected to the first reset signal end Re1. The first isolation circuit 4 may include a ninth transistor T9, a first terminal of the ninth transistor T9 is connected to the first node N1, a second terminal of the ninth transistor T9 is connected to the fourth node N4, and a gate of the ninth transistor T9 is connected to the second gate driving signal end G2, The second isolation circuit 5 may include an eighth transistor T8, a first terminal of the eighth transistor T8 is connected to the first node N1, a second terminal of the eighth transistor T8 is connected to the fifth node N5, and a gate of the eighth transistor T8 is connected to a third reset signal end Re3.

As shown in FIG. 1, the data writing circuit 7 may include a fourth transistor T4, a first terminal of the fourth transistor T4 is connected to the data signal end Da, a second terminal of the fourth transistor T4 is connected to the second node N2, and a gate of the fourth transistor T4 is connected to the second gate driving signal end G2. The light emitting control circuit 6 may include a fifth transistor T5 and a sixth transistor T6. A first terminal of the fifth transistor T5 is connected to the first power supply end VDD, a second terminal of the fifth transistor T5 is connected to the second node N2, and a gate of the fifth transistor T5 is connected to the enable signal end EM. A first terminal of the sixth transistor T6 is connected to the third node N3, a second terminal of the sixth transistor T6 is connected to the first electrode of the light emitting unit OLED, and a gate of the sixth transistor T6 is connected to the enable signal end EM. The second reset circuit 8 may include a seventh transistor T7, a first terminal of the seventh transistor T7 is connected to the second initial signal end Vinit2, a second terminal of the seventh transistor T7 is connected to the first electrode of the light emitting unit OLED, and a gate of the seventh transistor T7 is connected to the second reset signal end Re2. The storage circuit may include a capacitor C, a first electrode of the capacitor C is connected to the first node N1, and a second electrode of the capacitor C is connected to the first power supply end VDD.

As shown in FIG. 1, the first transistor T1 and the second transistor T2 may be N-type transistors, and the driving transistor T3, the fourth transistor T4, the fifth transistor T5, the sixth transistor T6, the seventh transistor T7, the eighth transistor T8, and the ninth transistor T9 may be P-type transistors.

Figure 2:
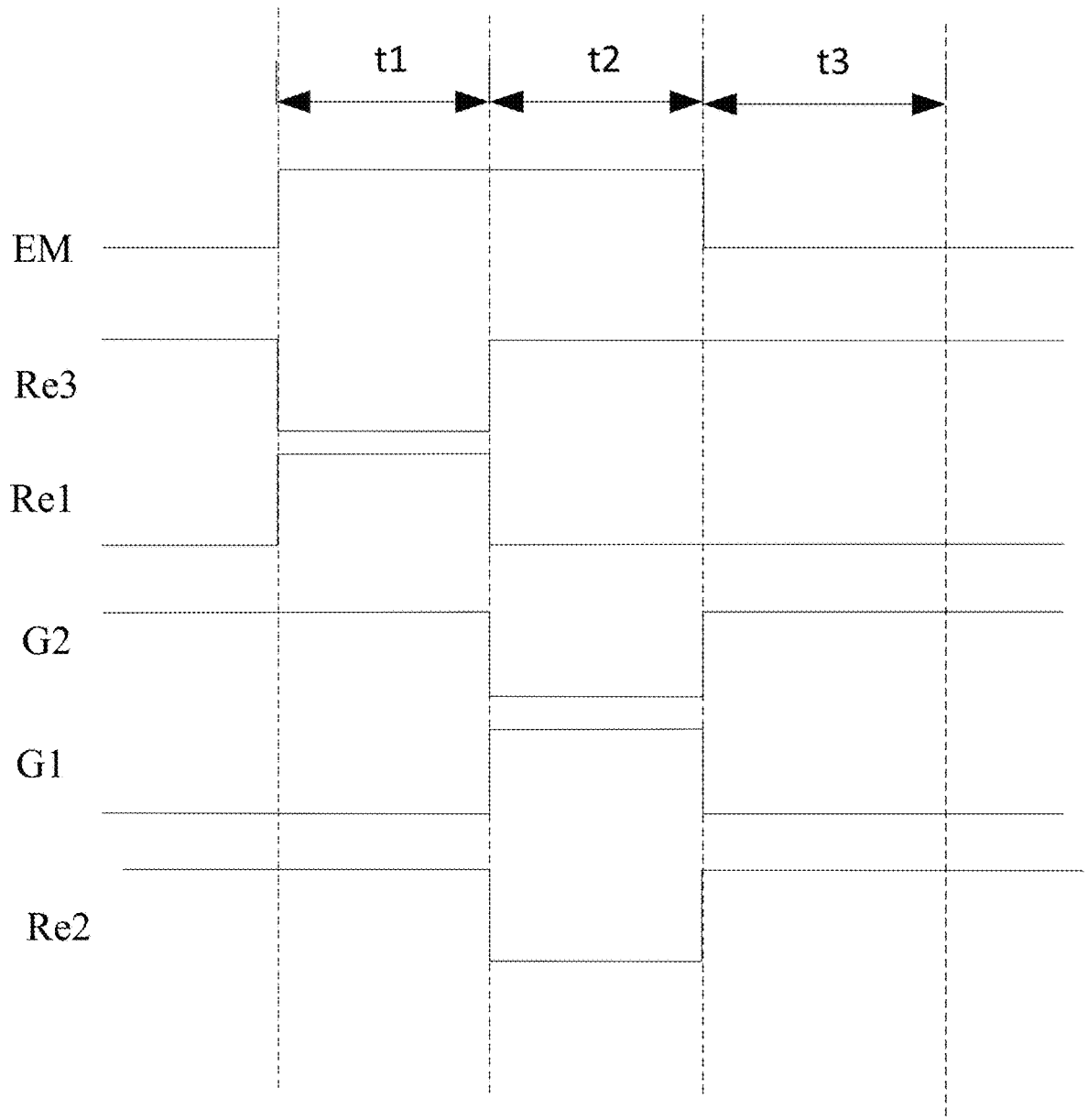
FIG. 2 is a timing diagram of each control signal in a driving method for the pixel driving circuit shown in FIG. 1.

FIG. 2 is a timing diagram of each control signal in a driving method for the pixel driving circuit shown in FIG. 1. As shown in FIG. 2, G1 represents the timing diagram of the first gate driving signal end, G2 represents the timing diagram of the second gate driving signal end, Re1 represents the timing diagram of the first reset signal end, Re2 represents the timing diagram of the second reset signal end, Re3 represents the timing diagram of the third reset signal end, and EM represents the timing diagram of the enable signal end.

The driving method for the pixel driving circuit may include a reset phase t1, a data writing phase t2, and a light emitting phase t3. In the reset phase t1, the enable signal end EM, the first reset signal end Re1, the second reset signal end Re2, and the second gate driving signal end G2 output high level signals, the third reset signal end Re3 and the first gate driving signal end G1 output low level signals, the first transistor T1 and the eighth transistor T8 are conducted, and the first initial signal end Vinit1 inputs a first initial signal to the first node N1. In the data writing phase t2, the enable signal end EM, the third reset signal end Re3, and the first gate driving signal end G1 output high level signals, the first reset signal end Re1, the second gate driving signal end G2, and the second reset signal end Re2 output low level signals, the second transistor T2, the fourth transistor T4, and the seventh transistor T7 are conducted, at the same time, the data signal end Da outputs a data signal to write the compensation voltage Vdata+Vth to the first node N1, where Vdata is a voltage of the data signal, Vth is a threshold voltage of the driving transistor T3, and the second initial signal end Vini2 inputs a second initial signal to the first electrode of the light emitting unit OLED. In the light emitting phase t3, the enable signal end EM outputs a low level signal, the sixth transistor T6 and the fifth transistor T5 are conducted, and the driving transistor T3 drives the light emitting unit OLED to emit light under the action of the voltage Vdata+Vth of the first node N1. The output current, of the driving transistor in the pixel driving circuit of the present disclosure, $I=(\mu W Cox/2L)(Vdata+Vth-Vdd-Vth)^2$, where μ is a carrier mobility, Cox is a gate capacity per unit area, W is a width of a channel of the driving transistor, L is the length of the channel of the driving transistor, Vgs is the gate source voltage difference of the driving transistor, and Vth is the threshold voltage of the driving transistor. The pixel driving circuit can avoid the impact of the threshold of the driving transistor on its output current. It should be understood that in other embodiments, the pixel driving circuit may also have other driving methods, for example, the seventh transistor T7 may also be on during the time period between the data writing phase and the light emitting phase to reset the first electrode of the light emitting unit OLED.

Figure 3:
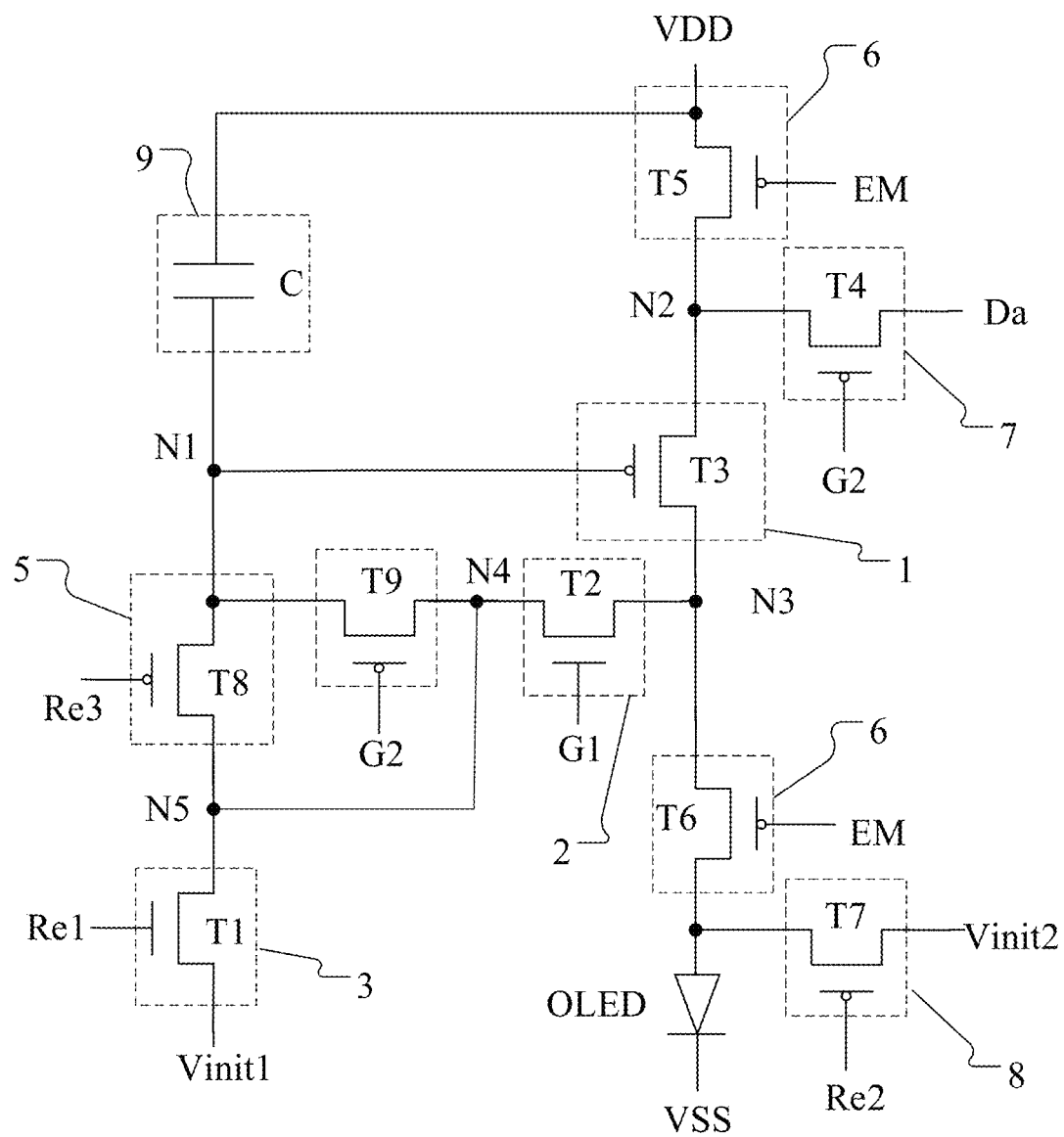
FIG. 3 is a schematic structure diagram of a pixel driving circuit of another embodiment of the present disclosure.

FIG. 3 is a schematic structure diagram of a pixel driving circuit of another embodiment of the present disclosure. Compared to the pixel driving circuit shown in FIG. 1, the fourth node N4 and the fifth node N5 in the pixel driving circuit shown in FIG. 3 are connected. This pixel driving circuit may also reduce the leakage current from the first node N1 to the first initial signal end Vinit1 and the third node N3.

It should be understood that in other embodiments, at least part of the transistors in the first transistor T1 and second transistor T2 may also be P-type transistors, and at least part of the transistors in the driving transistor T3, fourth transistor T4, fifth transistor T5, sixth transistor T6, seventh transistor T7, eighth transistor T8, and ninth transistor T9 may also be N-type transistors. For example, the second transistor T2 and the ninth transistor T9 may both be P-type transistors or N-type transistors, and correspondingly, the gate of the second transistor T2 and the gate of the ninth transistor T9 may be connected to the same control signal end. For another example, the second transistor T2 and the fourth transistor T4 may both be P-type transistors or N-type transistors, and correspondingly, the gate of the second transistor T2 and the gate of the fourth transistor T4 may be connected to the same control signal end. For another example, the first transistor T1 and the eighth transistor T8 may both be P-type transistors or N-type transistors, and correspondingly, the gate of the first transistor T1 and the gate of the eighth transistor T8 may be connected to the same control signal end. In addition, at least one of the gate of the eighth transistor T8 and the gate of the ninth transistor T9 may also be connected to an effective level end, that is, at least one of the eighth transistor T8 and the ninth transistor T9 may be always on under the action of the effective level end.

Figure 4:
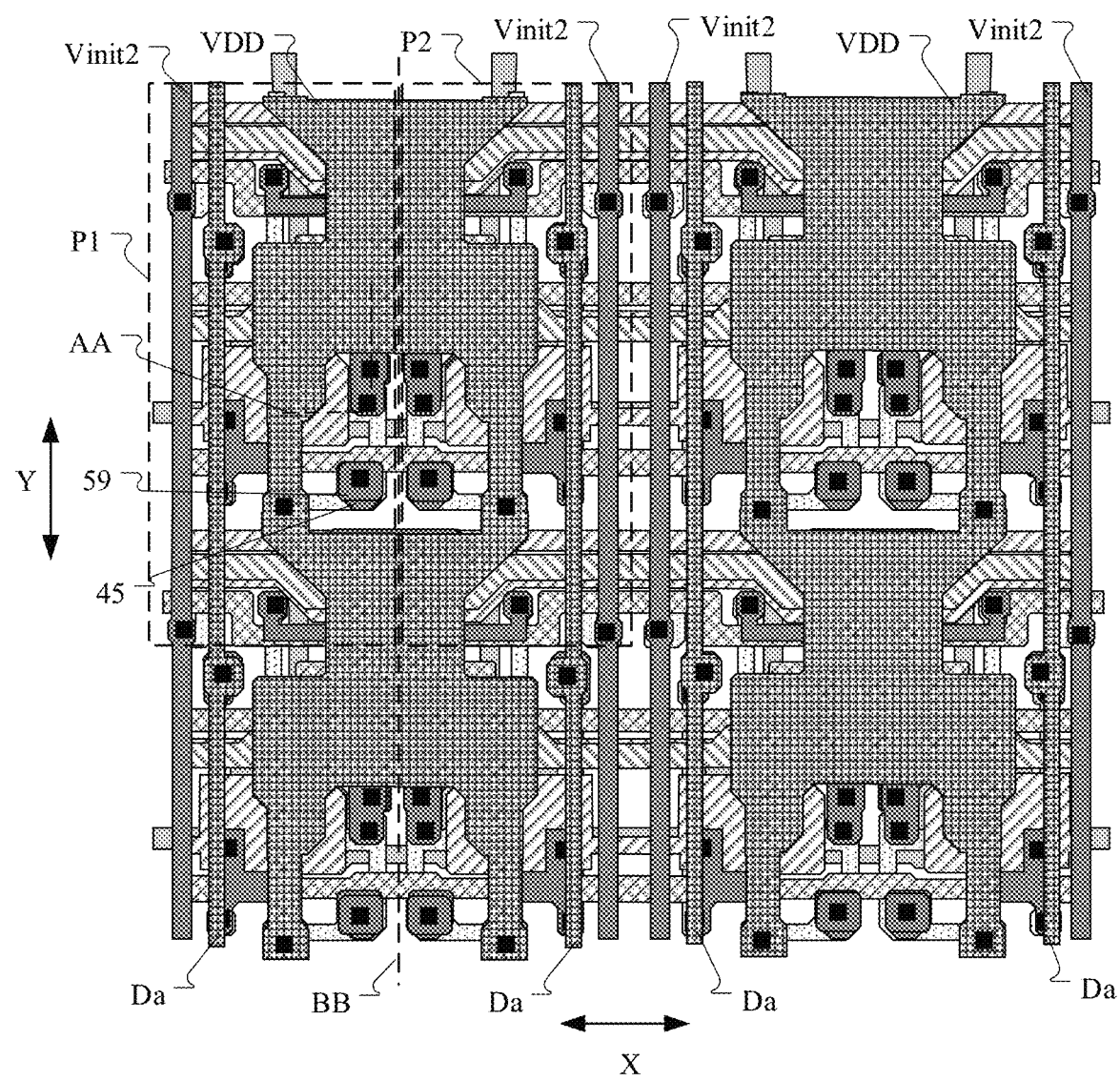
FIG. 4 is a structure layout diagram of a display panel of one embodiment of the present disclosure.
Figure 5:
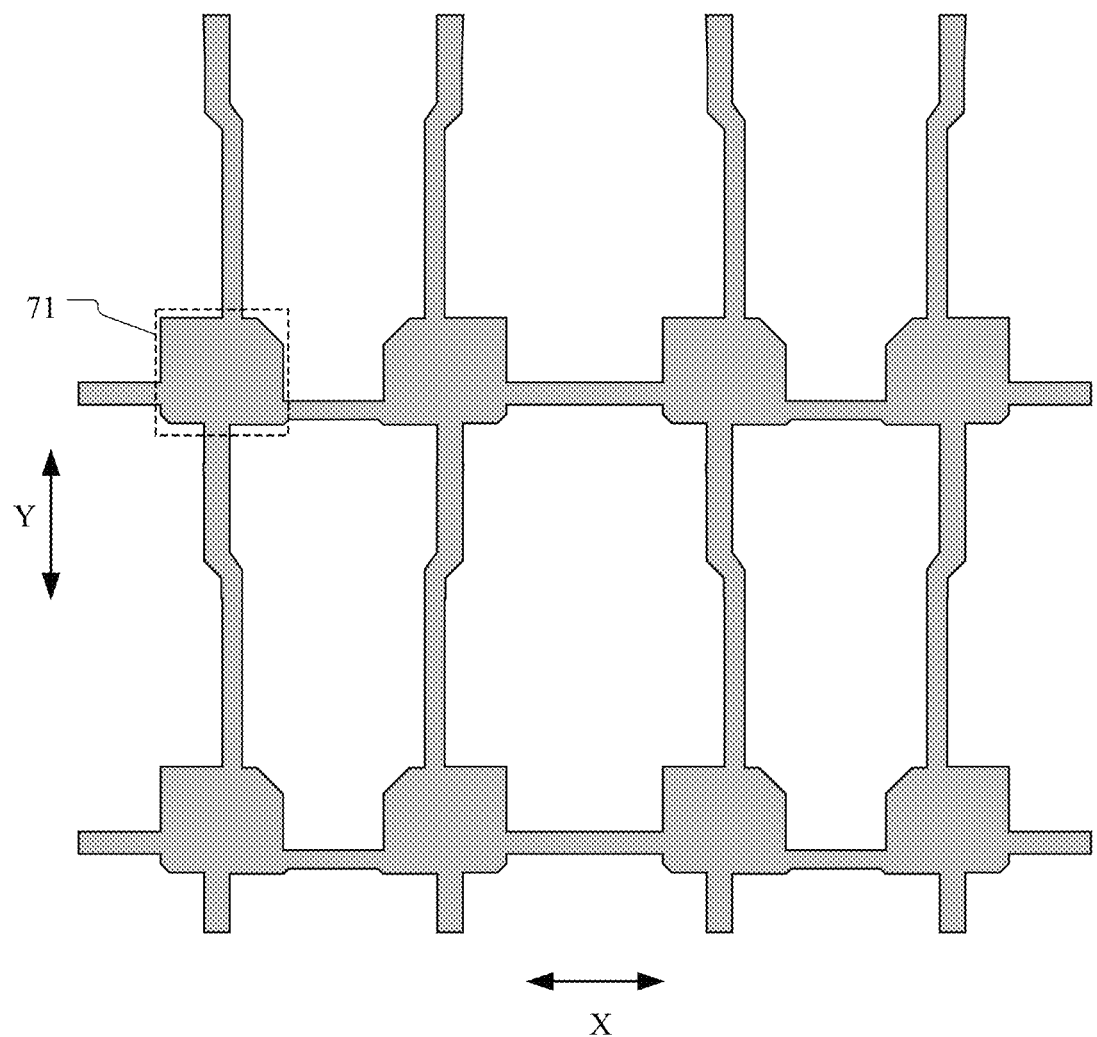
FIG. 5 is a structure layout diagram of the shielding layer in FIG. 4.
Figure 6:
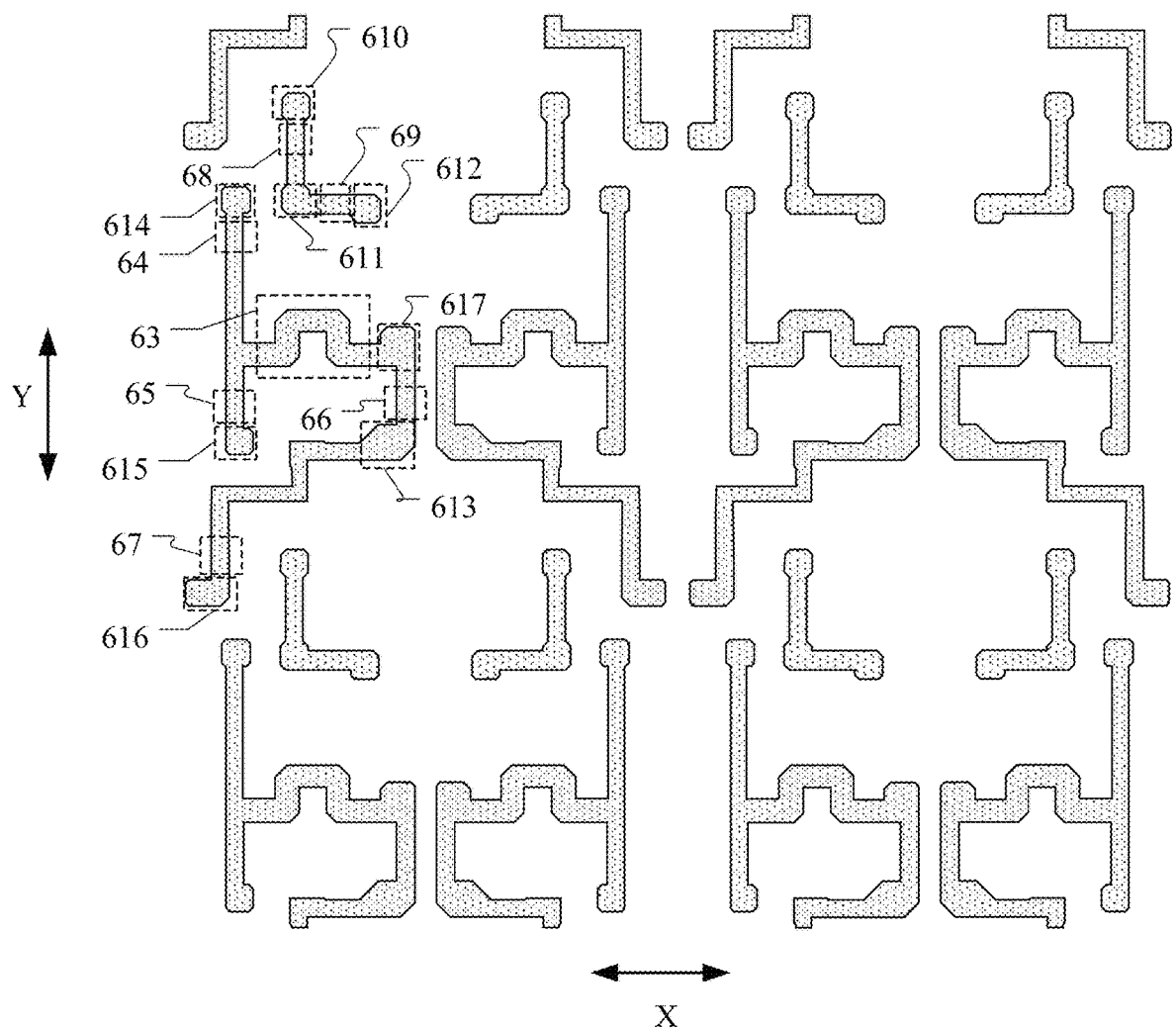
FIG. 6 is a structure layout diagram of the first active layer in FIG. 4.
Figure 7:
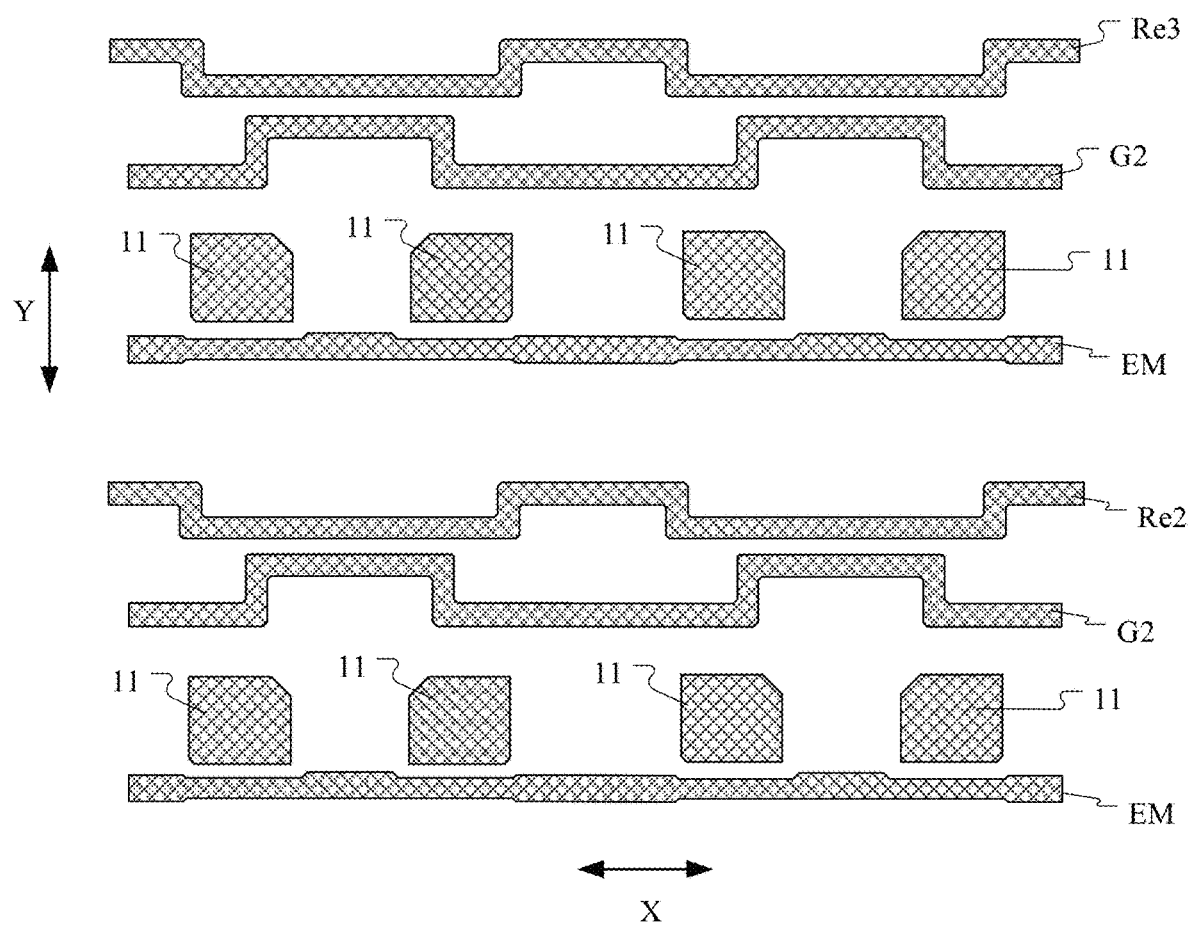
FIG. 7 is a structure layout diagram of the first conductive layer in FIG. 4.
Figure 8:
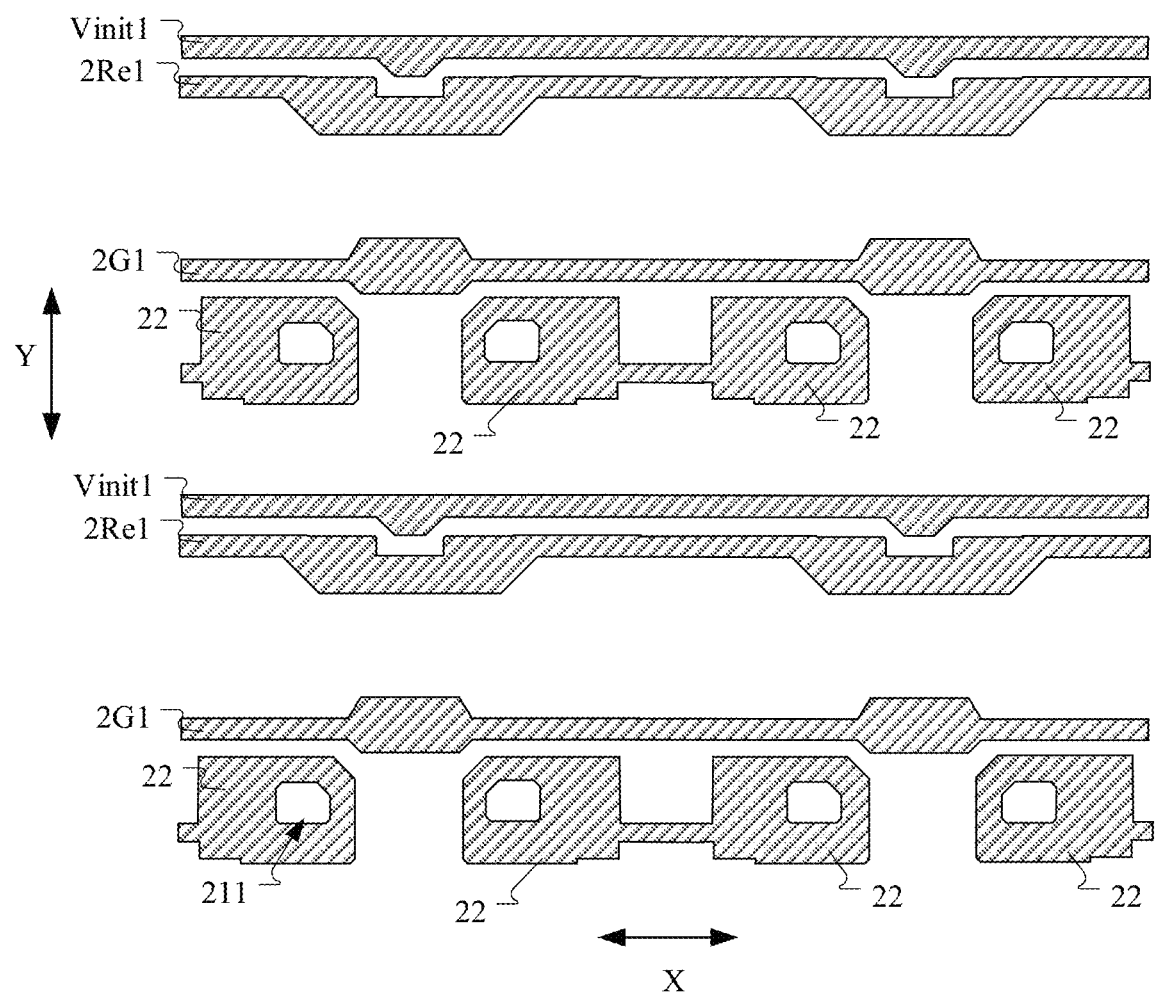
FIG. 8 is a structure layout diagram of the second conductive layer in FIG. 4.
Figure 9:
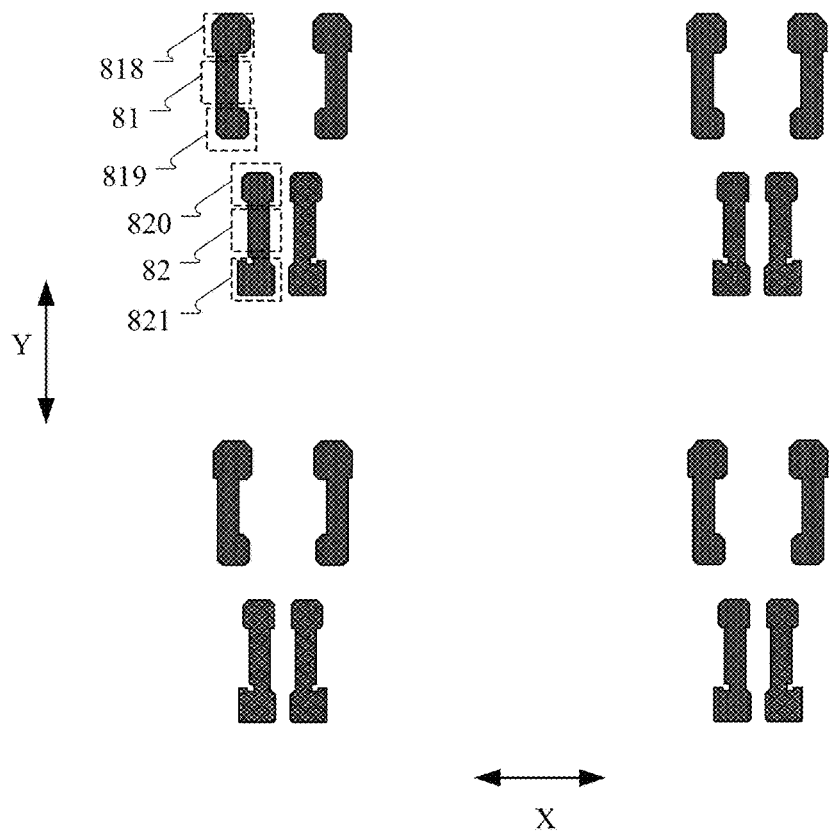
FIG. 9 is a structure layout diagram of the second active layer in FIG. 4.
Figure 10:
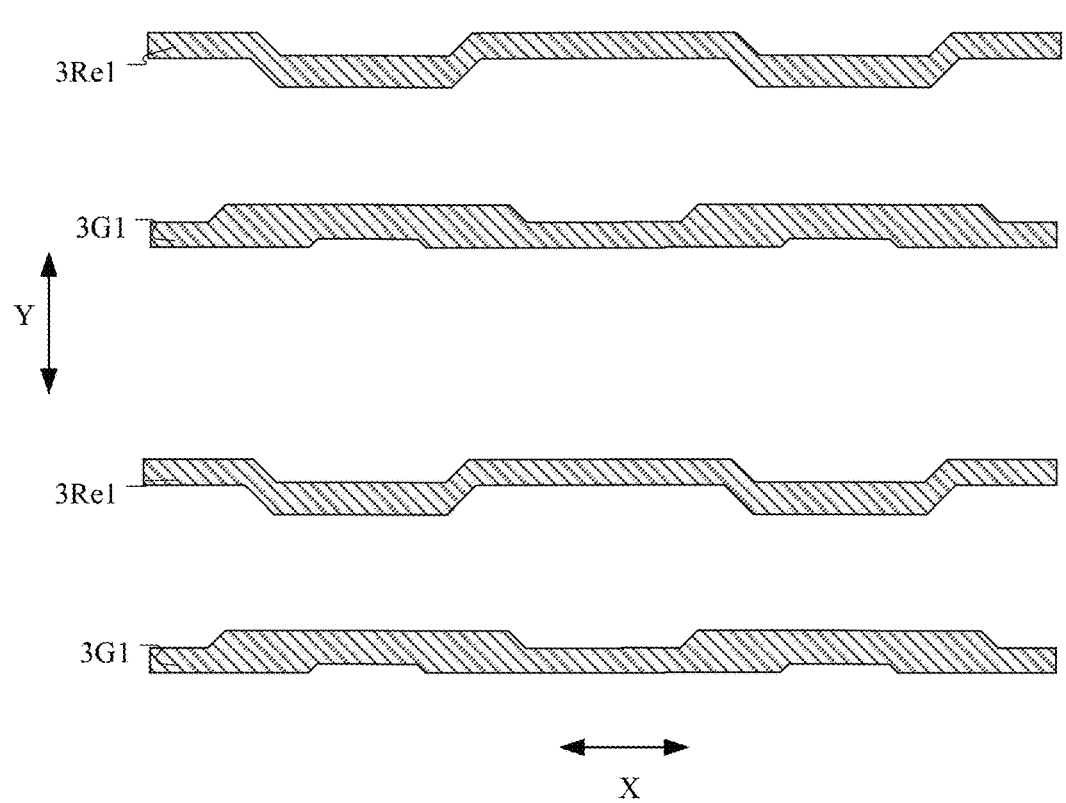
FIG. 10 is a structure layout diagram of the third conductive layer in FIG. 4.
Figure 11:
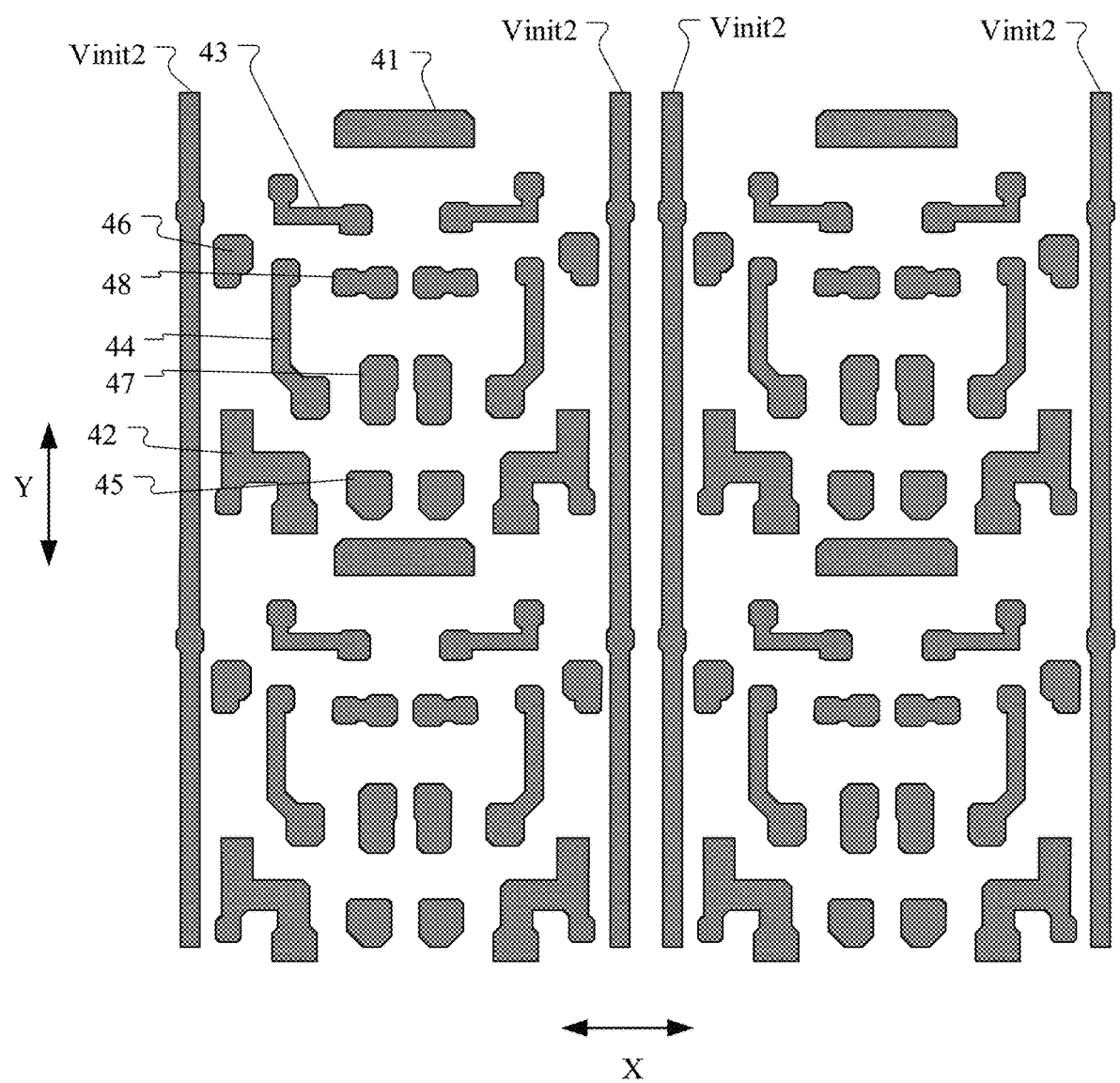
FIG. 11 is a structure layout diagram of the fourth conductive layer in FIG. 4.
Figure 12:
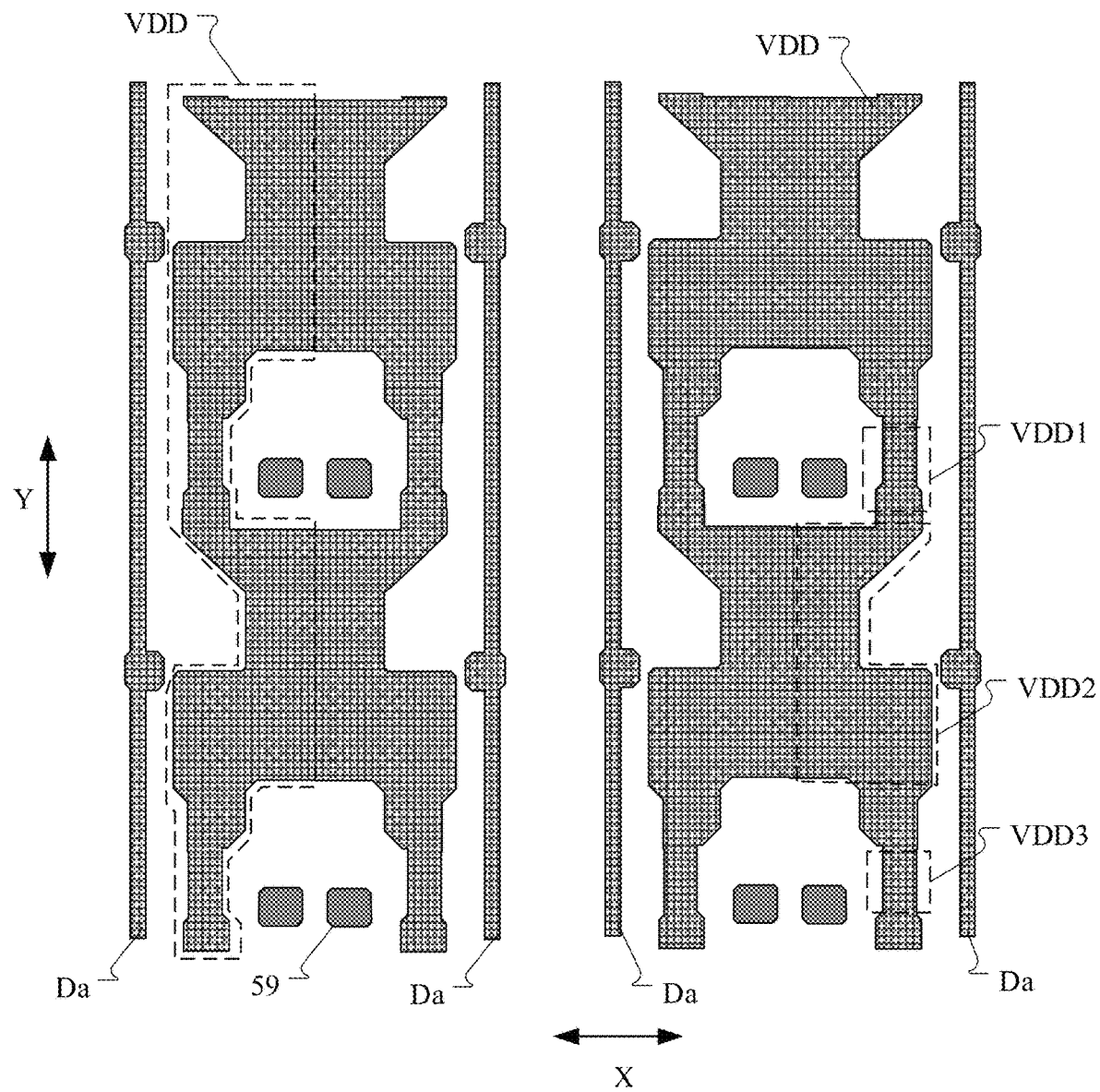
FIG. 12 is a structure layout diagram of the fifth conductive layer in FIG. 4.
Figure 13:
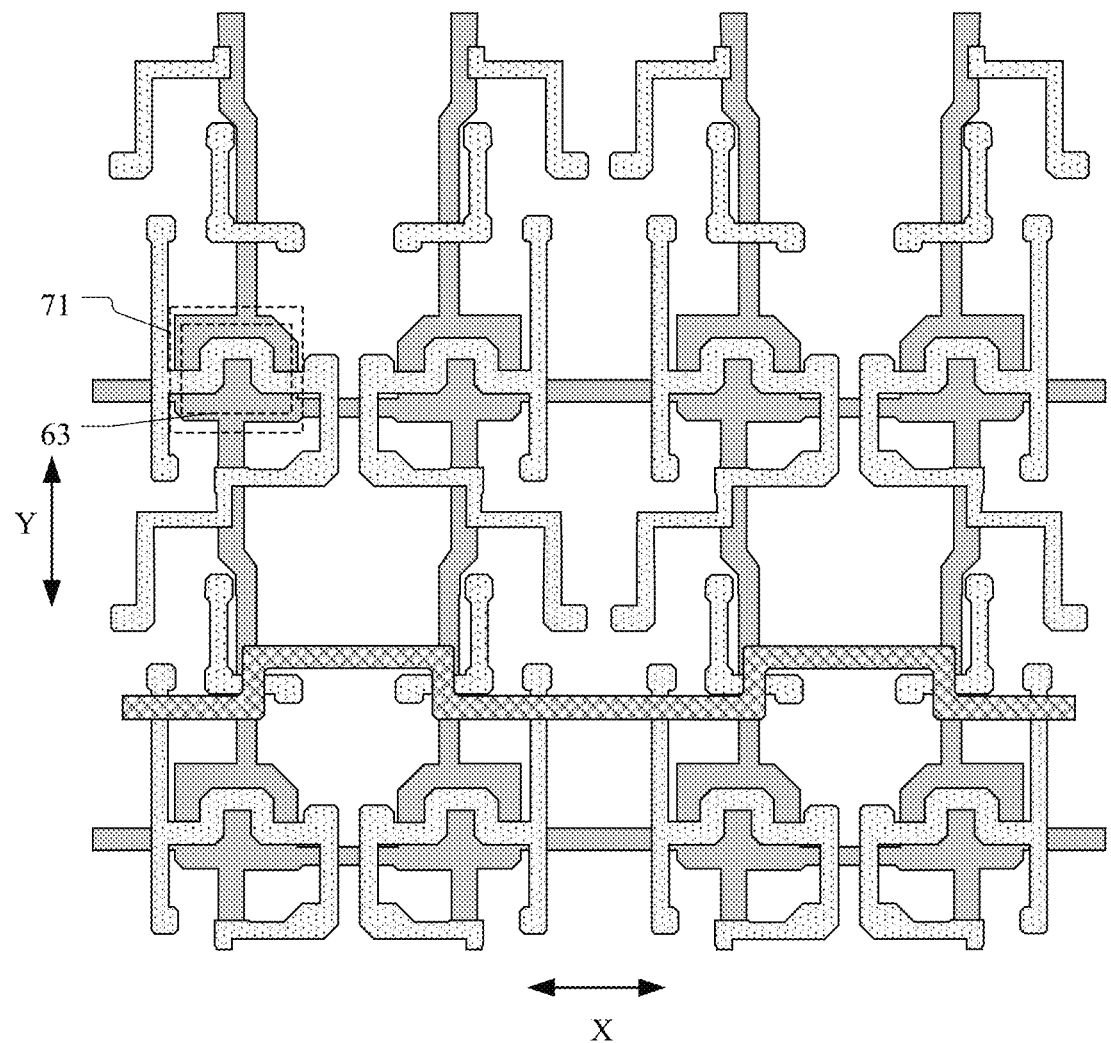
FIG. 13 is a structure layout diagram of the shielding layer and the first active layer in FIG. 4.
Figure 14:
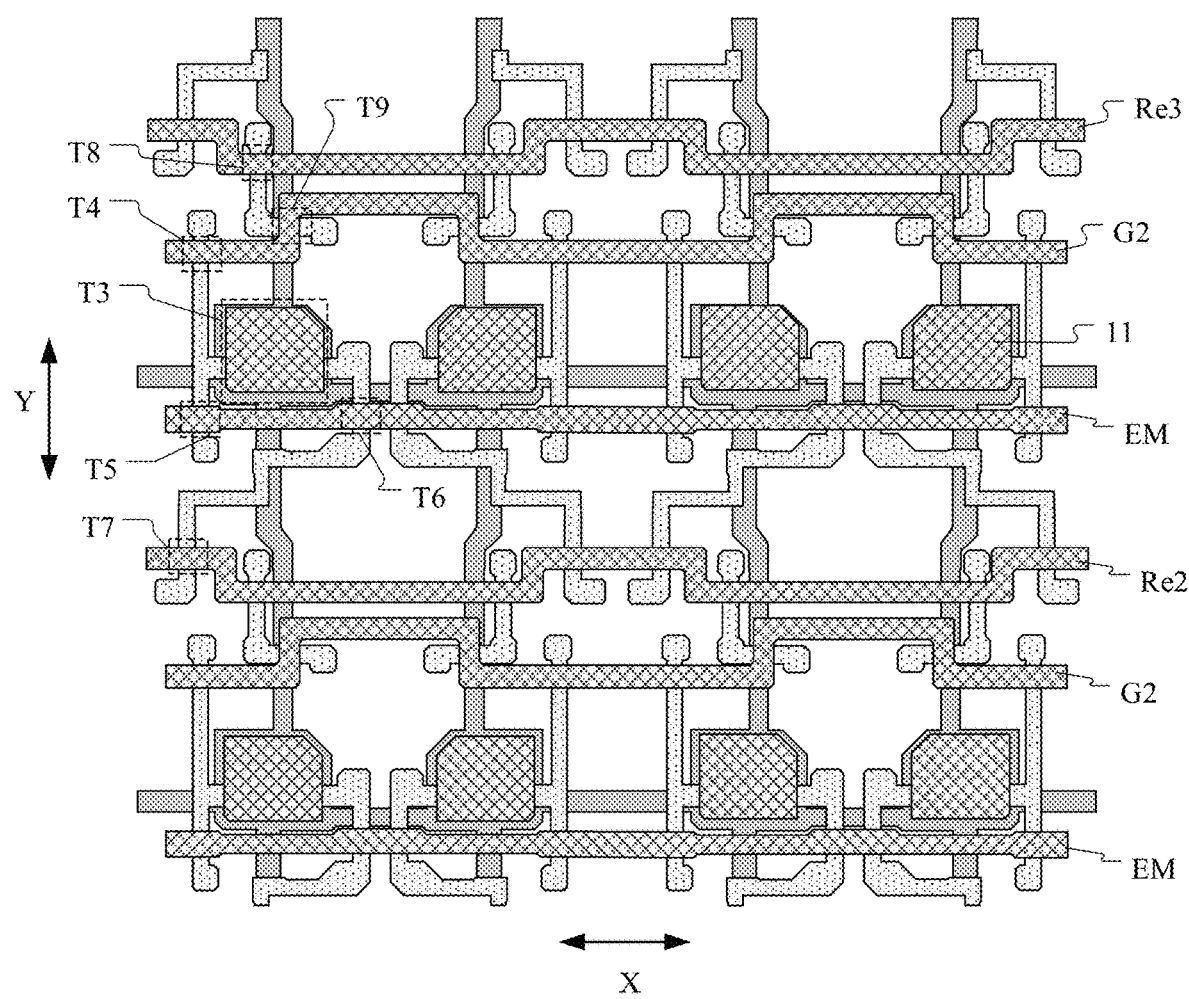
FIG. 14 is a structure layout diagram of the shielding layer, the first active layer, and the first conductive layer in FIG. 4.
Figure 15:
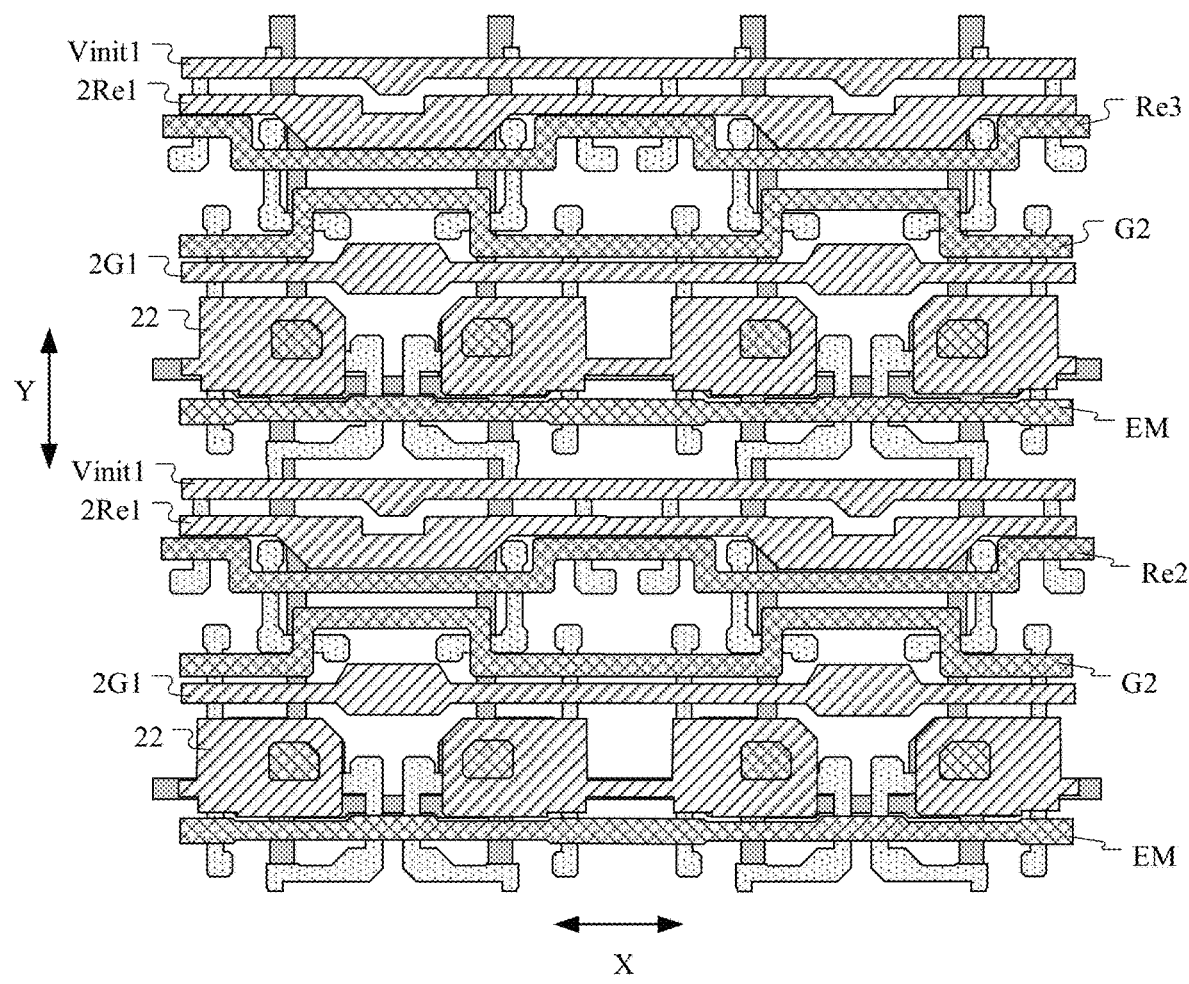
FIG. 15 is a structure layout diagram of the shielding layer, the first active layer, the first conductive layer, and the second conductive layer in FIG. 4.
Figure 16:
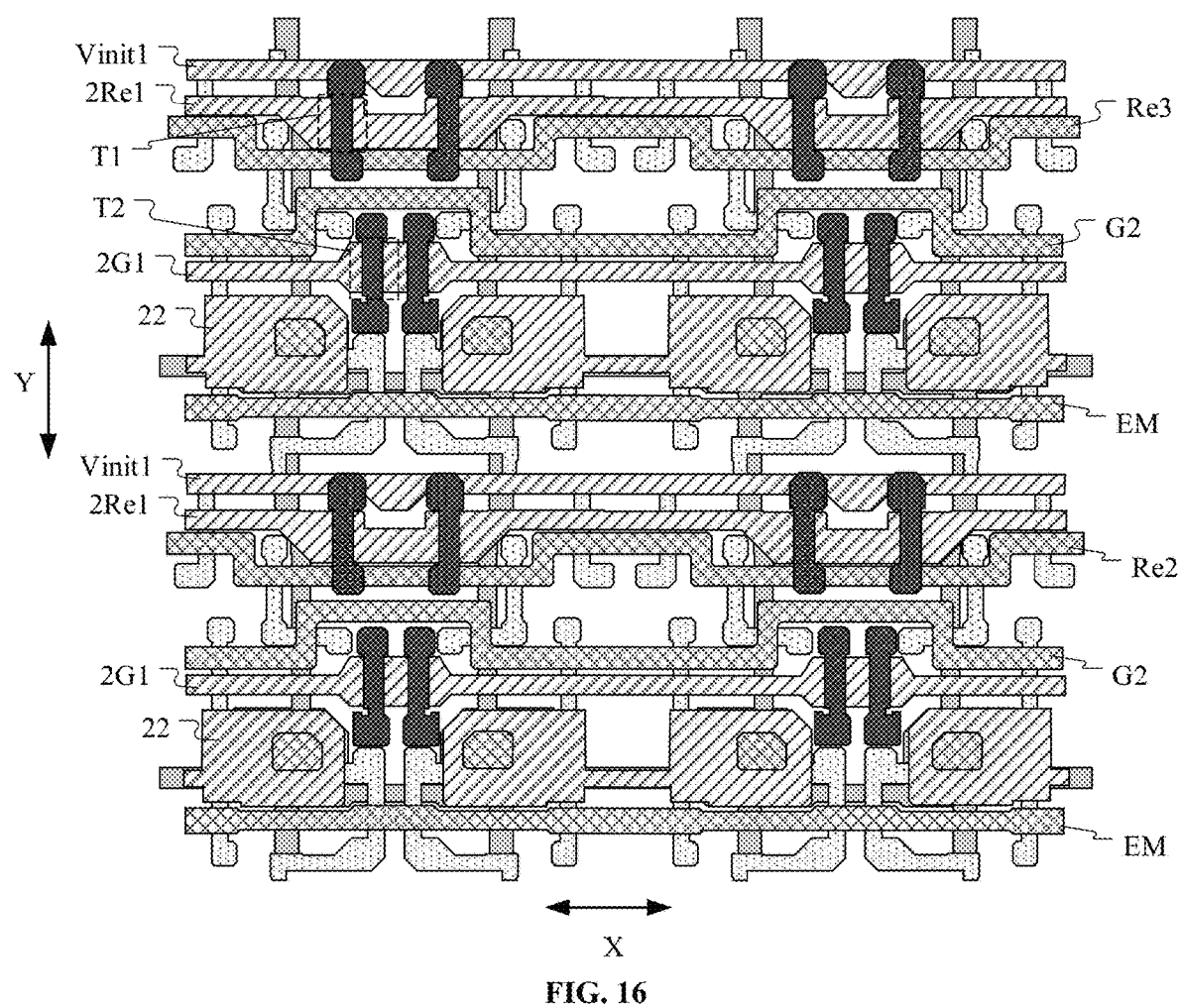
FIG. 16 is a structure layout diagram of the shielding layer, the first active layer, the first conductive layer, the second conductive layer, and the second active layer in FIG. 4.
Figure 17:
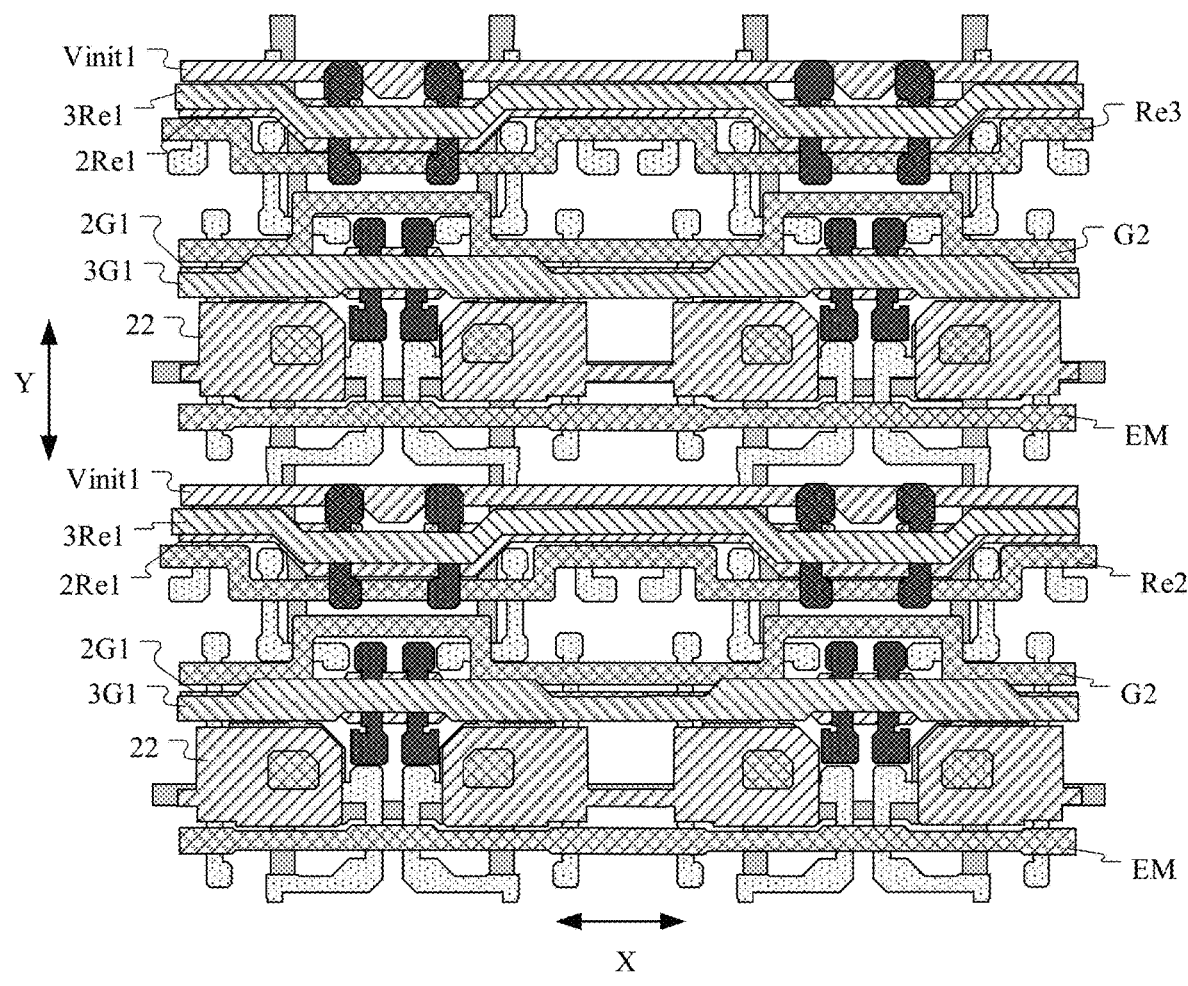
FIG. 17 is a structure layout diagram of the shielding layer, the first active layer, the first conductive layer, the second conductive layer, the second active layer, and the third conductive layer in FIG. 4.
Figure 18:
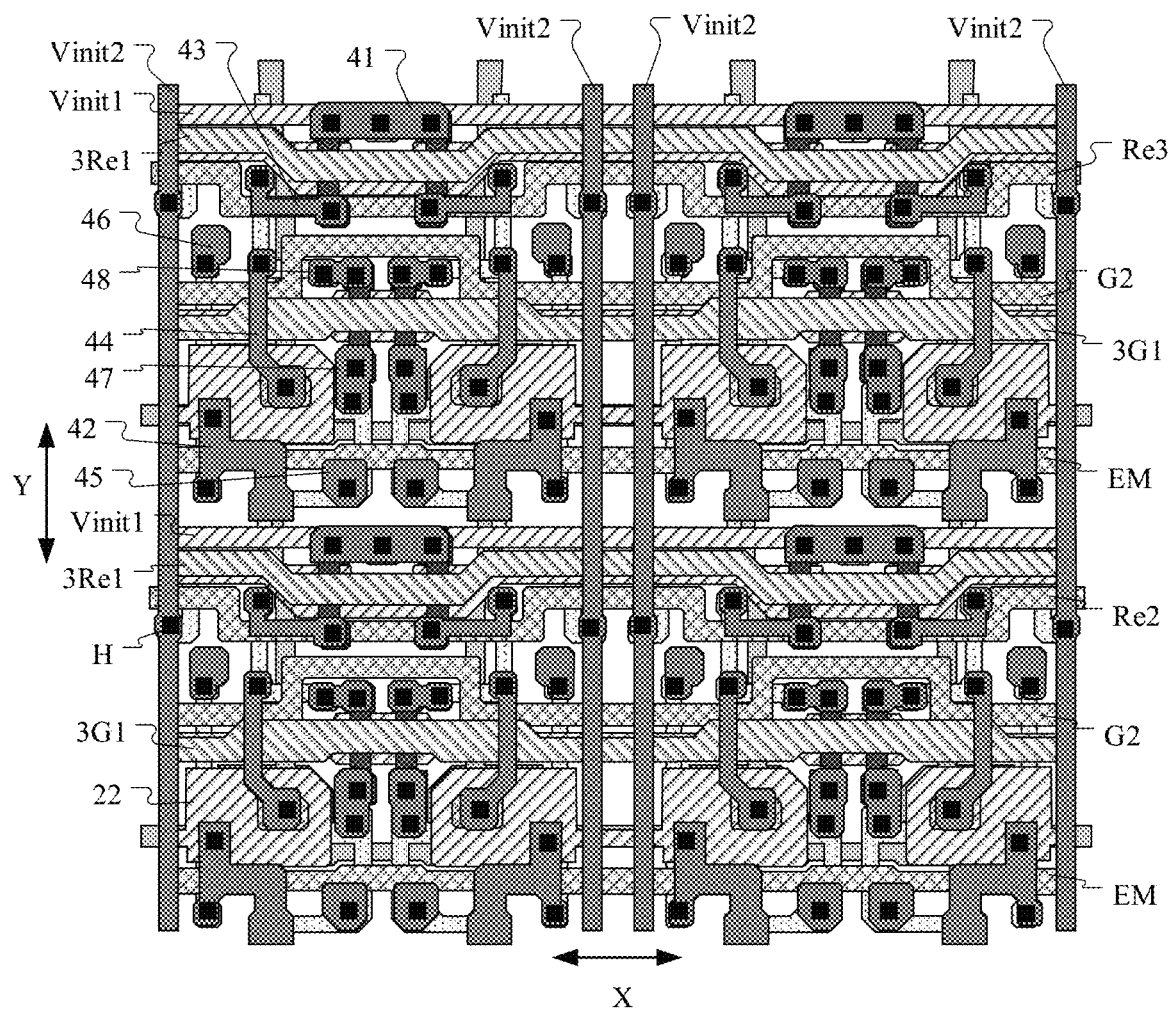
FIG. 18 is a structure layout diagram of the shielding layer, the first active layer, the first conductive layer, the second conductive layer, the second active layer, the third conductive layer, and the fourth conductive layer in FIG. 4.

In one embodiment, a display panel is also provided. The display panel may include a substrate, a shielding layer, a first active layer, a first conductive layer, a second conductive layer, a second active layer, a third conductive layer, a fourth conductive layer, and a fifth conductive layer arranged in sequential laminated order, where an insulating layer may be arranged between adjacent layers described above. As shown in FIGS. 4-18, FIG. 4 is a structure layout diagram of a display panel of one embodiment of the present disclosure, FIG. 5 is a structure layout diagram of the shielding layer in FIG. 4, FIG. 6 is a structure layout diagram of the first active layer in FIG. 4, FIG. 7 is a structure layout diagram of the first conductive layer in FIG. 4, FIG. 8 is a structure layout diagram of the second conductive layer in FIG. 4, FIG. 9 is a structure layout diagram of the second active layer in FIG. 4, FIG. 10 is a structure layout diagram of the third conductive layer in FIG. 4, FIG. 11 is a structure layout diagram of the fourth conductive layer in FIG. 4, FIG. 12 is a structure layout diagram of the fifth conductive layer in FIG. 4, FIG. 13 is a structure layout diagram of the shielding layer and the first active layer in FIG. 4, FIG. 14 is a structure layout diagram of the shielding layer, the first active layer, and the first conductive layer in FIG. 4, FIG. 15 is a structure layout diagram of the shielding layer, the first active layer, the first conductive layer, and the second conductive layer in FIG. 4, FIG. 16 is a structure layout diagram of the shielding layer, the first active layer, the first conductive layer, the second conductive layer, and the second active layer in FIG. 4, FIG. 17 is a structure layout diagram of the shielding layer, the first active layer, the first conductive layer, the second conductive layer, the second active layer, and the third conductive layer in FIG. 4, FIG. 18 is a structure layout diagram of the shielding layer, the first active layer, the first conductive layer, the second conductive layer, the second active layer, the third conductive layer, and the fourth conductive layer in FIG. 4. The display panel may include a plurality of pixel driving circuits as shown in FIG. 1. As shown in FIG. 4, the plurality of pixel driving circuits may include a first pixel driving circuit P1 and a second pixel driving circuit P2 distributed adjacent to each other in a first direction X. The first pixel driving circuit P1 and the second pixel driving circuit P2 may be arranged in mirror symmetry relative to a mirror symmetry plane BB. The mirror symmetry plane BB may be perpendicular to the substrate. An orthographic projection of the first pixel driving circuit P1 on the substrate and an orthographic projection of the second pixel driving circuit P2 on the substrate may be set symmetrically with the intersection of the mirror symmetry plane BB and the substrate as the symmetry axis. The first pixel driving circuit P1 and the second pixel driving circuit P2 may form a repeating cell, and the display panel may include a plurality of repeating cells distributed in an array along a first direction X and a second direction Y. The first direction X may be a row direction and the second direction Y may be a column direction.

As shown in FIGS. 4, 5 and 13, the shielding layer may include a plurality of shielding portions 71, and adjacent shielding portions 71 may be connected to each other.

As shown in FIGS. 4, 6 and 14, the first active layer may include a third active portion 63, a fourth active portion 64, a fifth active portion 65, a sixth active portion 66, a seventh active portion 67, an eighth active portion 68, and a ninth active portion 69. The third active portion 63 is used for forming a channel region of the driving transistor T3, the fourth active portion 64 is used for forming a channel region of the fourth transistor T4, the fifth active portion 65 is used for forming a channel region of the fifth transistor T5, the sixth active portion 66 is used for forming a channel region of the sixth transistor T6, the seventh active portion 67 is used for forming a channel region of the seventh transistor T7, the eighth active portion 68 is used for forming a channel region of the eighth transistor T8, and the ninth active portion 69 is used for forming a channel region of the ninth transistor T9. In addition, the first active layer may further include: a tenth active portion 610, an eleventh active portion 611, a twelfth active portion 612, a thirteenth active portion 613, a fourteenth active portion 614, a fifteenth active portion 615, a sixteenth active portion 616, and a seventeenth active portion 617. The tenth active portion 610 is connected to an end of the eighth active portion 68 away from the ninth active portion 69; the eleventh active portion 611 is connected between the eighth active portion 68 and the ninth active portion 69; the twelfth active portion 612 is connected to an end of the ninth active portion 69 away from the eighth active portion 68; the thirteenth active portion 613 is connected between the sixth active portion 66 and the seventh active portion 67; the fourteenth active portion 614 is connected to an end of the fourth active portion 64 away from the third active portion 63; the fifteenth active portion 615 is connected to an end of the fifth active portion 65 away from the third active portion 63; the sixteenth active portion 616 is connected to an end of the seventh active portion 67 away from the sixth active portion 66; and the seventeenth active portion 617 is connected between the third active portion 63 and the sixth active portion 66. An orthographic projection of the shielding portion 71 on the substrate may cover an orthographic projection of the third active portion 63 on the substrate, and the shielding portion 71 may shade the third active portion 63 to reduce the impact of light on the driving characteristics of the driving transistor T3. In addition, the shielding layer may also be connected to a stable voltage source, for example, the shielding layer may be connected to the first power supply end VDD, the second power supply end VSS, the first initial signal end Vinit1, the second initial signal end Vinit2, etc. The shielding layer may also shield the noise impact of other signals on the driving transistor T3. The first active layer may be formed from polycrystalline silicon material, and correspondingly, the driving transistor T3, the fourth transistor T4, the fifth transistor T5, the sixth transistor T6, the seventh transistor T7, the eighth transistor T8, and the ninth transistor T9 may be P-type low temperature polycrystalline silicon thin film transistors.

As shown in FIGS. 4, 7 and 14, the first conductive layer may include a second reset signal line Re2, a second gate line G2, an enable signal line EM, a third reset signal line Re3, and a first conductive portion 11. An orthographic projection of the second reset signal line Re2 on the substrate, an orthographic projection of the second gate line G2 on the substrate, an orthographic projection of the enable signal line EM on the substrate, and an orthographic projection of the third reset signal line Re3 on the substrate may all extend along the first direction X. In this embodiment, an orthographic projection of a particular structure on the substrate extends along a certain direction, which may be understood to mean that the orthographic projection of the structure on the substrate extends in that direction in a straight line or in a bend. The second reset signal line Re2 may be used for providing the second reset signal end in FIG. 1. The orthographic projection of the second reset signal line Re2 on the substrate may cover an orthographic projection of the seventh active portion 67 on the substrate, and a partial structure of the second reset signal line Re2 may be used for forming the gate of the seventh transistor. The second gate line G2 may be used for providing the second gate driving signal end in FIG. 1. The orthographic projection of the second gate line G2 on the substrate may cover an orthographic projection of the fourth active portion 64 on the substrate and an orthographic projection of the ninth active portion 69 on the substrate, and a partial structure of the second gate line G2 may be used for forming the gate of the fourth transistor T4 and the gate of the ninth transistor T9, respectively. The enable signal line EM may be used for providing the enable signal end in FIG. 1, the orthographic projection of the enable signal line EM on the substrate may cover an orthographic projection of the fifth active portion 65 on the substrate and an orthographic projection of the sixth active portion 66 on the substrate, and a partial structure of the enable signal line EM may be used for forming the gate of the fifth transistor T5 and the gate of the sixth transistor T6, respectively. The third reset signal line Re3 may be used for providing the third reset signal end in FIG. 1, the orthographic projection of the third reset signal line Re3 on the substrate may cover an orthographic projection of the eighth active portion 68 on the substrate, and a partial structure of the third reset signal line Re3 may be used for forming the gate of the eighth transistor T8. An orthographic projection of the first conductive portion 11 on the substrate may cover the orthographic projection of the third active portion 63 on the substrate, and the first conductive portion 11 may be used for forming the gate of the driving transistor T3 and the first electrode of the capacitor C.

As shown in FIGS. 4, 7 and 14, the orthographic projection of the third reset signal line Re3 on the substrate, the orthographic projection of the second gate line G2 on the substrate, the orthographic projection of the first conductive portion 11 on the substrate, the orthographic projection of the enable signal line EM on the substrate, and the orthographic projection of the second reset signal line Re2 on the substrate may be distributed sequentially along the second direction Y. The second reset signal line Re2 in the pixel driving circuits of one row is multiplexed as the third reset signal line Re3 in the pixel driving circuits of one adjacent next row, and this setting can reduce the size of the pixel driving circuit in the second direction Y. In addition, the display panel may conduct conductive processing on the first active layer by using the first conductive layer as a mask, i.e., the area in the first active layer covered by the first conductive layer may form a channel area of the transistor, and the area in the first active layer not covered by the first conductive layer forms a conductor structure.

As shown in FIGS. 4, 8 and 15, the second conductive layer may include: a third gate line 2G1, a fourth reset signal line 2Re1, a first initial signal line Vinit1, and a second conductive portion 22. An orthographic projection of the third gate line 2G1 on the substrate, an orthographic projection of the fourth reset signal line 2Re1 on the substrate, an orthographic projection of the first initial signal line Vinit1 on the substrate may all extend along the first direction X. The third gate line 2G1 is used for providing the first gate driving signal end in FIG. 1. The first initial signal line Vinit is used for providing the first initial signal end in FIG. 1. The fourth reset signal line 2Re1 is used for providing the first reset signal end in FIG. 1. An orthographic projection of the second conductive portion 22 on the substrate and the orthographic projection of the first conductive portion 11 on the substrate at least partially overlap. The second conductive portion 22 may be used for forming the second electrode of the capacitor C. Adjacent second conductive portions 22 in adjacent repeating cells in the first direction X may be connected to each other. As shown in FIGS. 4, 8 and 15, the orthographic projection of the first initial signal line Vinit1, in the pixel driving circuits of one adjacent next row, on the substrate, may be located between the orthographic projection of the second reset signal line Re2, in the pixel driving circuits of one row, on the substrate, and the orthographic projection of the enable signal line EM, in the pixel driving circuits of this row, on the substrate. This setting can reduce the size of the pixel driving circuit in the second direction Y.

As shown in FIGS. 4, 9 and 16, the second active layer may include a first active portion 81 and a second active portion 82. The first active portion 81 is used for forming a channel region of the first transistor T1, and the second active portion 82 is used for forming a channel region of the second transistor T2. The second active layer may further include an eighteenth active portion 818, a nineteenth active portion 819, a twentieth active portion 820, and a twenty-first active portion 821. The eighteenth active portion 818 and the nineteenth active portion 819 are connected to two ends of the first active portion 81. The twentieth active portion 820 and the twenty-first active portion 821 are connected to two ends of the second active portion 82. The orthographic projection of the third gate line 2G1 on the substrate covers an orthographic projection of the second active portion 82 on the substrate, and a partial structure of the third gate line 2G1 is used for forming a bottom gate of the second transistor T2. The orthographic projection of the fourth reset signal line 2Re1 on the substrate covers an orthographic projection of the first active portion 81 on the substrate, and a partial structure of the fourth reset signal line 2Re1 is used for forming a bottom gate of the first transistor T1. The second active layer may be formed from indium gallium zinc oxide, and correspondingly, the first transistor T1 and the second transistor T2 may be N-type metal oxide thin film transistors.

As shown in FIGS. 4, 10 and 17, the third conductive layer may include a first gate line 3G1 and a first reset signal line 3Re1. An orthographic projection of the first gate line 3G1 on the substrate extends along the first direction X and covers the orthographic projection of the second active portion 82 on the substrate, and a partial structure of the first gate line 3G1 may be used for forming a top gate of the second transistor T2. The first gate line 3G1 may be connected to the third gate line 2G1 through a via, and the via connected between the first gate line 3G1 and the third gate line 2G1 may be located in an edge alignment area around a display area of the display panel. An orthographic projection of the first reset signal line 3Re1 on the substrate extends along the first direction X and covers the orthographic projection of the first active portion 81 on the substrate, and a partial structure of the first reset signal line 3Re1 may be used for forming a top gate of the first transistor T1. The first reset signal line 3Re1 may be connected to the fourth reset signal line 2Re1 through a via, and the via connected between the first reset signal line 3Re1 and the fourth reset signal line 2Re1 may be located in the edge alignment area around the display area of the display panel.

As shown in FIGS. 4, 10 and 17, the orthographic projection of the first reset signal line 3Re1, in the pixel driving circuits of one adjacent next row, on the substrate, may be located between the orthographic projection of the second reset signal line Re2, in the pixel driving circuits of one row, on the substrate, and the orthographic projection of the first initial signal line Vinit1, in the pixel driving circuits of the adjacent next row, on the substrate. This setting can reduce the size of the pixel driving circuit in the second direction Y. In addition, the display panel may conduct conductive processing on the second active layer by using the third conductive layer as a mask, i.e., the area in the second active layer covered by the third conductive layer may form a channel area of the transistor, and the area in the second active layer not covered by the third conductive layer forms a conductor structure.

As shown in FIGS. 4, 11 and 18, the fourth conductive layer may include: a second initial signal line Vinit2, a first bridging portion 41, a second bridging portion 42, a third bridging portion 43, a fourth bridging portion 44, a fifth bridging portion 45, a sixth bridging portion 46, a seventh bridging portion 47, and an eighth bridging portion 48. The second initial signal line Vinit2 may be used for providing the second initial signal end in FIG. 1. An orthographic projection of the second initial signal line Vinit2 on the substrate may extend along the second direction Y. The second initial signal line Vinit2 may be connected to the sixteenth active portion 616 through a via H to connect the first terminal of the seventh transistor T7 and the first initial signal end. In this embodiment, a black square indicates a position of a via. The first bridging portion 41 may be connected to the first initial signal line Vinit1 and the eighteenth active portion 818, respectively, through a via to connect the first terminal of the first transistor T1 and the first initial signal end. The second bridging portion 42 may be connected to the fifteenth active portion 615 and the second conductive portion 22, respectively, through a via to connect the first electrode of the fifth transistor T5 and the second electrode of the capacitor C. The third bridging portion 43 may be connected to the tenth active portion 610 and the nineteenth active portion 819, respectively, through a via to connect the second terminal of the eighth transistor T8 and the second terminal of the first transistor T1. The fourth bridging portion 44 may be connected to the eleventh active portion 611 and the first conductive portion 11, respectively, through a via to connect the first terminal of the eighth transistor T8, the first terminal of the ninth transistor T9, and the gate of the driving transistor T3. As shown in FIG. 9, an opening 221 is formed in the second conductive portion 22, and an orthographic projection of a via connected between the fourth bridging portion 44 and the first conductive portion 11, on the substrate, is located within an orthographic projection of the opening 221 on the substrate, so that the second conductive portion 22 and the via connected between the fourth bridging portion 44 and the first conductive portion 11 are insulated. The fifth bridging portion 45 may be connected to the thirteenth active portion 613 through a via to connect the second terminal of the sixth transistor T6. The sixth bridging portion 46 may be connected to the fourteenth active portion 614 through a via to connect the first terminal of the fourth transistor T4. The seventh bridging portion 47 may be connected to the seventeenth active portion 617 and the twenty-first active portion 821, respectively, through a via to connect the second terminal of the second transistor T2 and the second terminal of the driving transistor. The eighth bridging portion 48 may be connected to the twentieth active portion 820 and the twelfth active portion 612, respectively, through a via to connect the first terminal of the second transistor T2 and the second terminal of the ninth transistor T9.

As shown in FIGS. 4 and 12, the fifth conductive layer may include a data line Da, a power supply line VDD, and a ninth bridging portion 59. An orthographic projection of the data line Da on the substrate and an orthographic projection of the power supply line VDD on the substrate may both extend along the second direction Y. The data line Da is used for providing the data signal end, and the power supply line VDD is used for providing the first power supply end. The data line Da may be connected to the sixth bridging portion 46 through a via to connect the first terminal of the fourth transistor T4 and the data signal end. The power supply end VDD may be connected to the second bridging portion 42 through a via to connect the first power supply end and the first terminal of the fifth transistor T5. The ninth bridging portion 59 may be connected to the fifth bridging portion 45 through a via to connect the second terminal of the sixth transistor T6, and the ninth bridging portion 59 may also be used for connecting the first electrode of the light emitting unit. The power supply line VDD may include: a first extension portion VDD1, a second extension portion VDD2, and a third extension portion VDD3. The second extension portion VDD2 is connected between the first extension portion VDD1 and the third extension portion VDD3. An orthographic projection of the second extension portion VDD2 on the substrate has a larger size in the first direction X than an orthographic projection of the first extension portion on the substrate. The orthographic projection of the second extension portion VDD2 on the substrate has a larger size in the first direction X than an orthographic projection of the third extension portion VDD3 on the substrate. The orthographic projection of the second extension portion VDD2 on the substrate may cover the orthographic projection of the first active portion 81 on the substrate and the orthographic projection of the second active portion 82 on the substrate. The second extension portion VDD2 may reduce the impact of light on the characteristics of the first transistor T1 and the second transistor T2. The orthographic projection of the second extension portion VDD2 on the substrate may also cover an orthographic projection of the fourth bridging portion 44 on the substrate, and the second extension portion VDD2 may regulate and shield the fourth bridging portion 44 to reduce the voltage fluctuation of the gate of the driving transistor T3 in the light emitting phase. In the same repeating cell, second extension portions VDD2 in two power supply lines VDD may be connected to each other, so that the power supply lines VDD and the second conductive portion 22 may form a grid structure which can reduce the voltage drop of the power signal thereon.

It should be noted that, as shown in FIGS. 4 and 18, a black square drawn at a side of the fourth conductive layer away from the substrate indicates a via connecting the fourth conductive layer and a side of another layer facing the substrate; a black square drawn at a side of the fifth conductive layer away from the substrate indicates a via connecting the fifth conductive layer and a side of another layer facing the substrate. A black square indicates only a position of a via. Different vias indicated by black squares at different positions may pass through different insulating layers.

Figure 19:
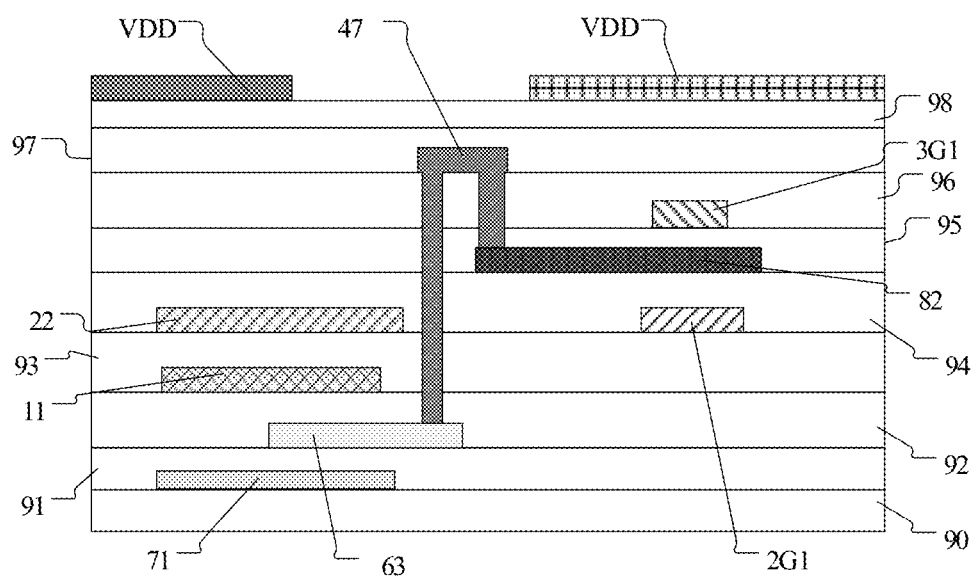
FIG. 19 is a partial cross-sectional view of the display panel shown in FIG. 4 dissected along the dashed line AA.

FIG. 19 is a partial cross-sectional view of the display panel shown in FIG. 4 dissected along the dashed line AA. The display panel may further include: a first insulating layer 91, a second insulating layer 92, a third insulating layer 93, a fourth insulating layer 94, a fifth insulating layer 95, a first dielectric layer 96, a passivation layer 97, and a first planarization layer 98. The substrate 90, the shielding layer, the first insulating layer 91, the first active layer, the second insulating layer 92, the first conductive layer, the third insulating layer 93, the second conductive layer, the fourth insulating layer 94, the second active layer, the fifth insulating layer 95, the third conductive layer, the first dielectric layer 96, the fourth conductive layer, the passivation layer 97, the first planarization layer 98, and the fifth conductive layer are arranged in sequential laminated order. The first insulating layer 91, the second insulating layer 92, the third insulating layer 93, the fourth insulating layer 94, and the fifth insulating layer 95 may be single-layer structures or multi-layer structures. The material of the first insulating layer 91, the second insulating layer 92, the third insulating layer 93, the fourth insulating layer 94, and the fifth insulating layer 95 may be at least one of: silicon nitride, silicon oxide, or silicon nitride oxide. The first dielectric layer 96 may be a silicon nitride layer. The material of the first planarization layer 98 may be an organic material such as polyimide (PI), polyethylene terephthalate (PET), polyethylene naphthalate (PEN), silicon-glass bonded structure (SOG), and other materials. The substrate 90 may include a glass substrate, a blocking layer, and a polyimide layer arranged in sequential laminated order. The blocking layer may be an inorganic material. The passivation layer 97 may be a silicon oxide layer. The material of the first conductive layer, the second conductive layer and the third conductive layer may be one of: molybdenum, aluminum, copper, titanium, or niobium, or an alloy, or a molybdenum/titanium alloy or laminate, etc. The material of the fourth conductive layer, the fifth conductive layer, and the sixth conductive layer may include a metallic material, such as one of molybdenum, aluminum, copper, titanium, or niobium, or an alloy, or a molybdenum/titanium alloy or laminate, or a titanium/aluminum/titanium laminate. The electrode layer may include an indium tin oxide layer and a silver layer. The square resistance of any one of the first conductive layer, the second conductive layer, and the third conductive layer may be greater than the square resistance of any one of the fourth conductive layer and the fifth conductive layer.

Figure 20:
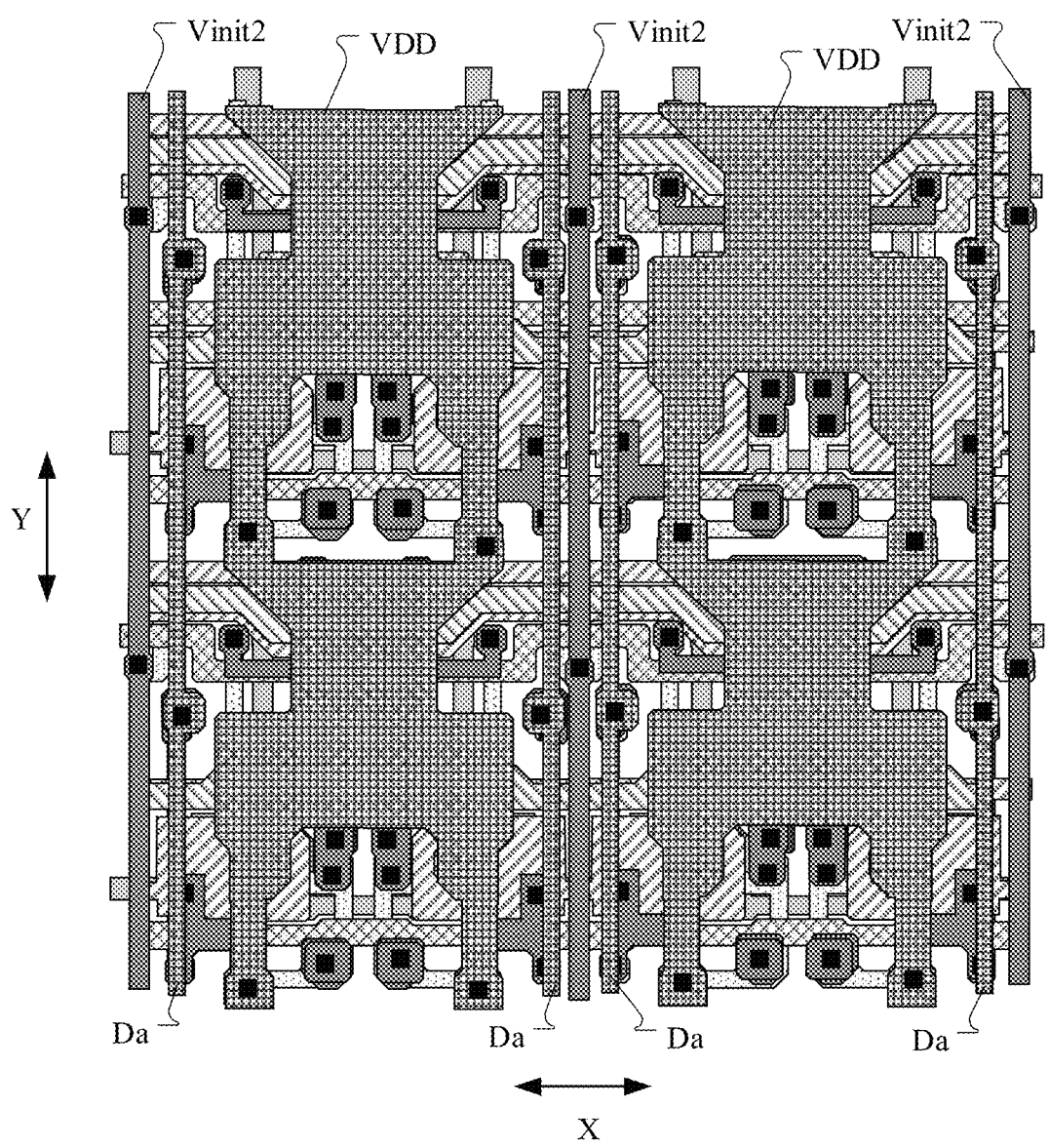
FIG. 20 is a structure layout diagram of a display panel of another embodiment of the present disclosure.
Figure 21:
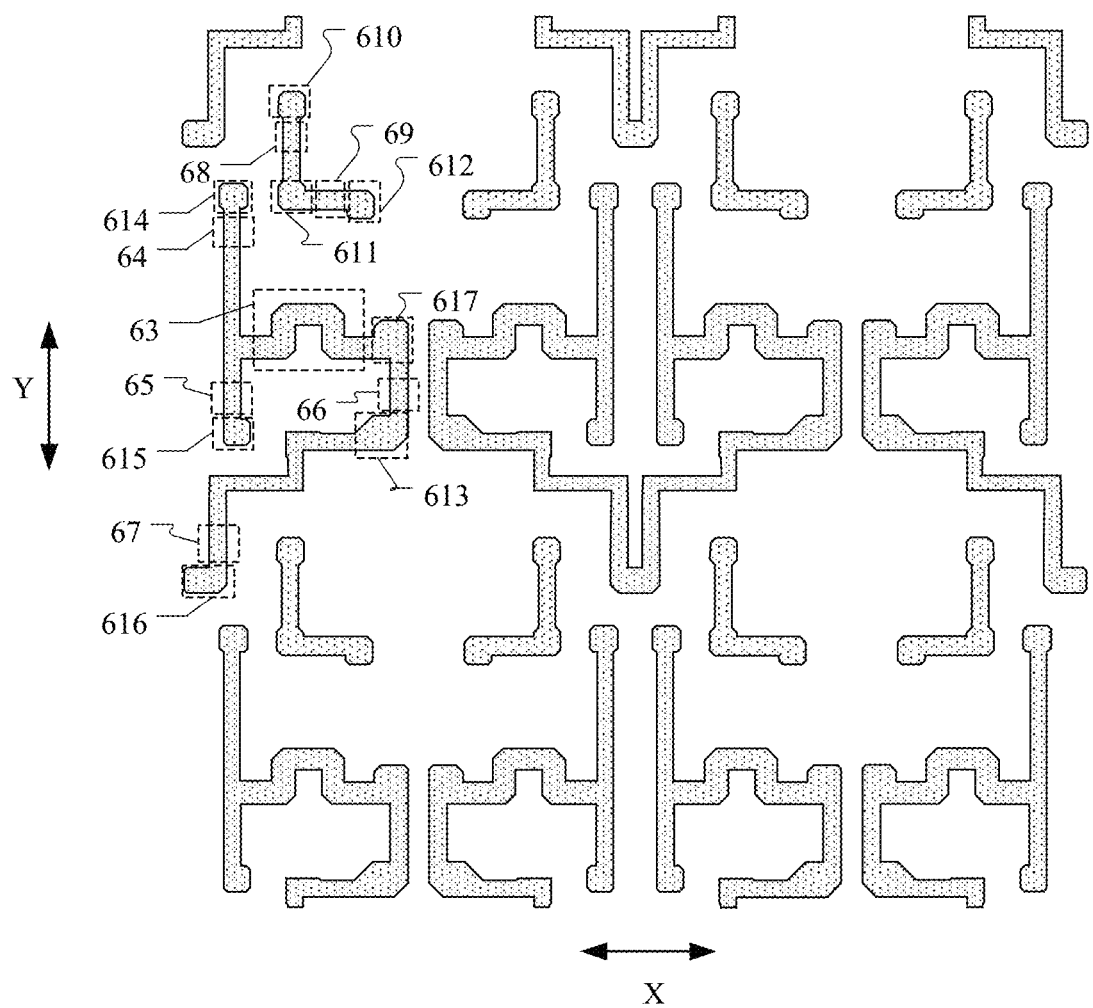
FIG. 21 is a structure layout diagram of the first active layer in FIG. 20.
Figure 22:
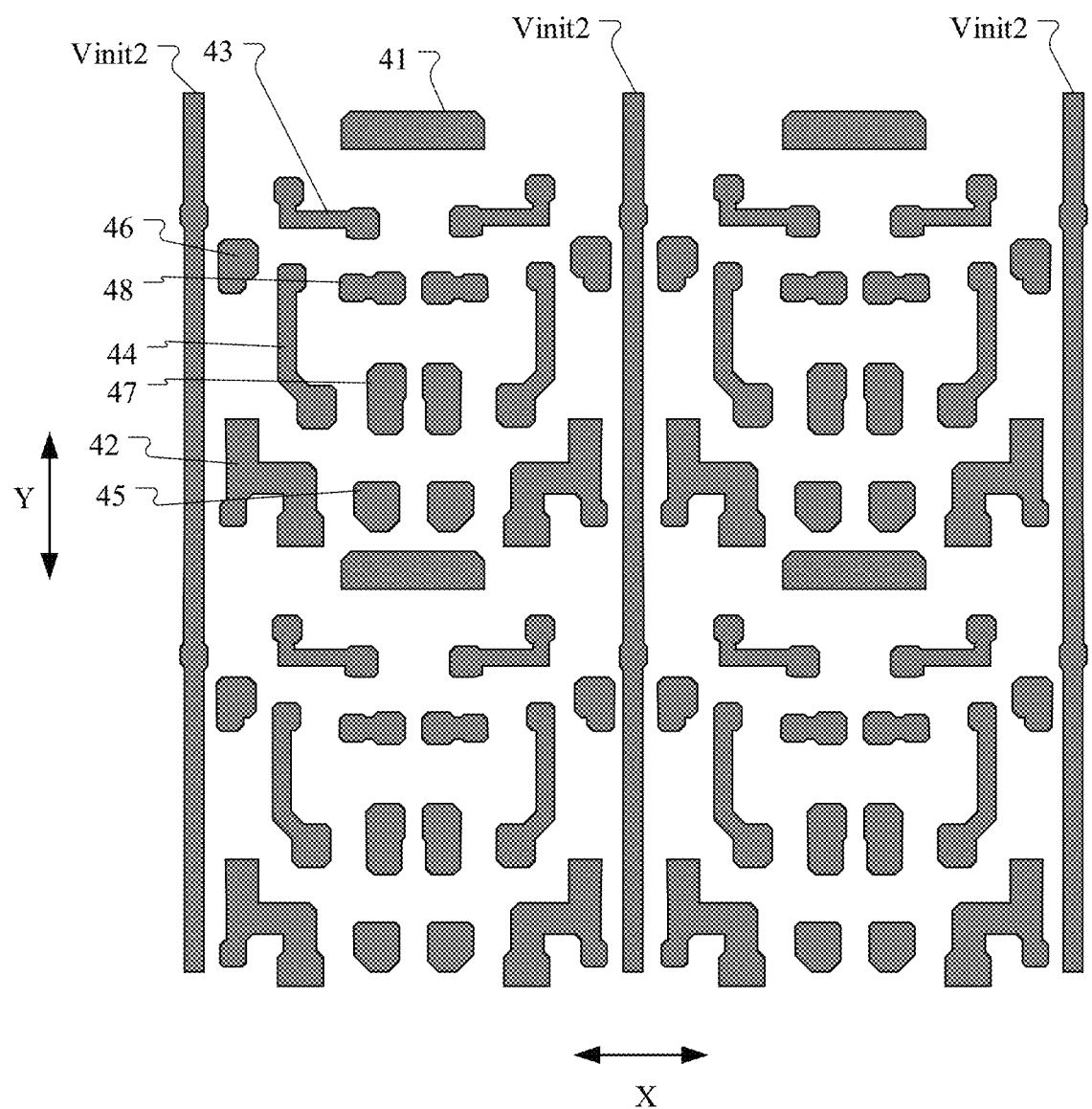
FIG. 22 is a structure layout diagram of the fourth conductive layer in FIG. 20.
Figure 23:
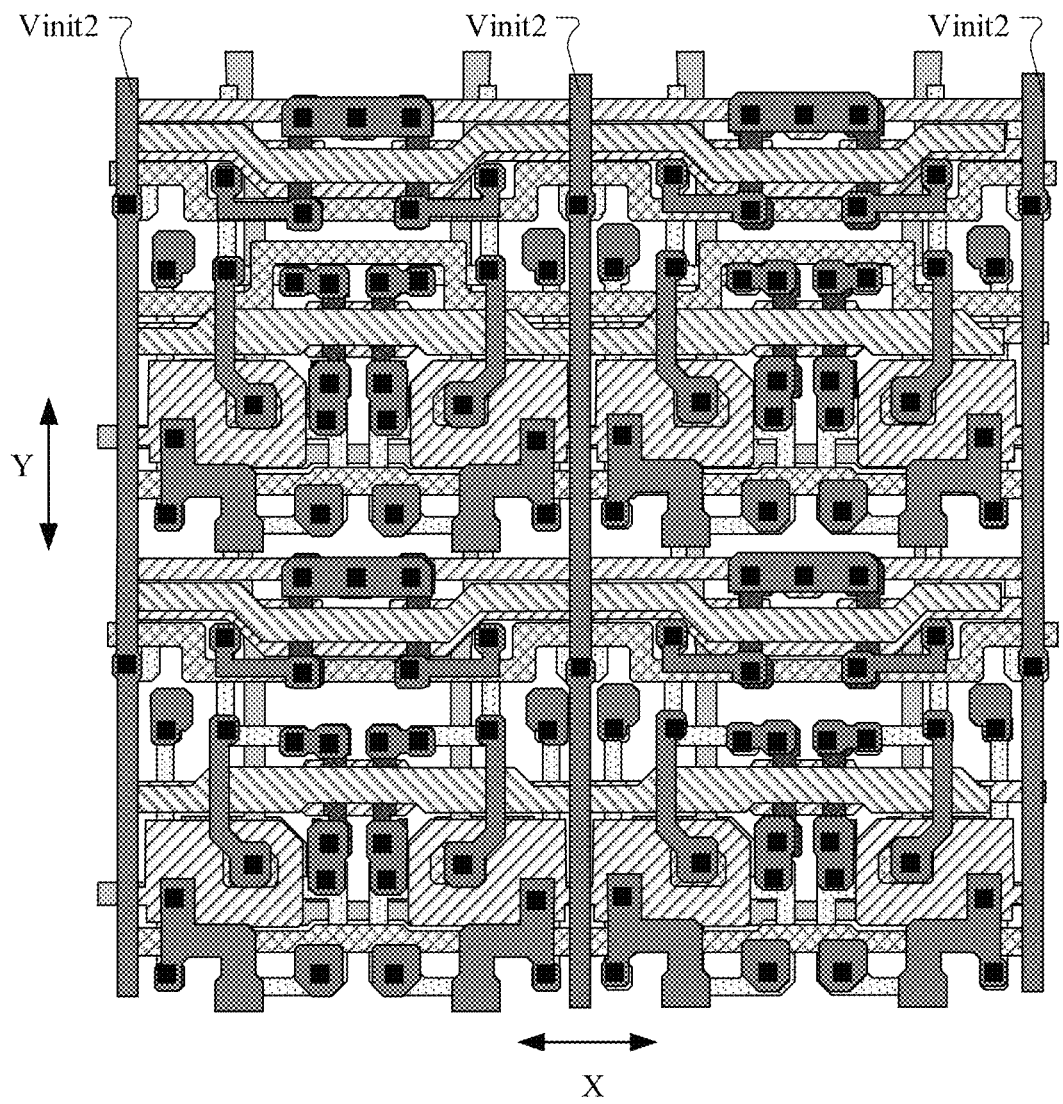
FIG. 23 is a structure layout diagram of the blocking layer, the first active layer, the first conductive layer, the second conductive layer, the second active layer, the third conductive layer, and the fourth conductive layer in FIG. 20.

FIG. 20 is a structure layout diagram of a display panel of another embodiment of the present disclosure. FIG. 21 is a structure layout diagram of the first active layer in FIG. 20. FIG. 22 is a structure layout diagram of the fourth conductive layer in FIG. 20. FIG. 23 is a structure layout diagram of the blocking layer, the first active layer, the first conductive layer, the second conductive layer, the second active layer, the third conductive layer, and the fourth conductive layer in FIG. 20.

The display panel shown in FIG. 20 differs from the display panel shown in FIG. 4 in that, adjacent sixteenth active portions 616 in adjacent repeating cells in the first direction X of the display panel shown in FIG. 20 may be connected to each other, and adjacent pixel driving circuits in adjacent repeating cells in the first direction X of the display panel shown in FIG. 20 may share the same second initial signal line Vinit2. This setting can simplify the structure of the display panel and can reduce the size of the pixel driving circuit in the first direction X.

It should be noted that the scale of the accompanying drawings in the present disclosure may be used as a reference in the actual process, but is not limited to this, e.g., the width to length ratio of the channel, the thickness and spacing of each film layer, and the width and spacing of each signal line may be adjusted according to the actual needs. The number of pixels in the display substrate and the number of sub-pixels in each pixel are also not limited to the number shown in the drawings, and the accompanying drawings described in the present disclosure are only structure schematics. In addition, the qualifiers such as first and second are used only to qualify different structure names, which have no meaning in a particular order. The same structure layer may be formed by the same composition process.

One embodiment of the present disclosure also provides a display device, and the display device includes the display panel described above. The display device may be a cell phone, a tablet computer, a television, etc.

After considering and practicing the content disclosed in the specification, those skilled in the art will easily come up with other embodiments of the present disclosure. The purpose of the present disclosure is to cover any variations, uses, or adaptations of the present disclosure, and the variations, uses, or adaptations follow the general principles of the present disclosure and include common knowledge or commonly used technical means in the technical field that are not disclosed in the present disclosure. The specification and embodiments are only considered to be examples, and the true scope and spirit of the present disclosure are indicated by the claims.

It should be understood that the present disclosure is not limited to the precise structure already described above and shown in the accompanying drawings, and various modifications and changes may be made without departing from the scope of the present disclosure. The scope of the present disclosure is limited only by the accompanying claims.

What is claimed is:

1. A pixel driving circuit, comprising:
   a driving circuit, connecting a first node, a second node, and a third node, and configured to provide, based on a voltage of the first node, a driving current to the third node by using the second node;
   a compensation circuit, connecting the third node, a fourth node, and a first gate driving signal end, and configured to conduct the third node and the fourth node in response to a signal of the first gate driving signal end;
   a first reset circuit, connecting a first initial signal end, a fifth node, and a first reset signal end, and configured to transmit a signal of the first initial signal end to the fifth node in response to a signal of the first reset signal end;

a first isolation circuit, connecting the first node and the fourth node, and configured to conduct the first node and the fourth node in response to a control signal, wherein the control signal of the first isolation circuit is different from the signal of the first gate driving signal end; and a second isolation circuit, connecting the first node and the fifth node, and configured to conduct the first node and the fifth node in response to another control signal, wherein the another control signal of the second isolation circuit is different from the signal of the first reset signal end.

2. The pixel driving circuit according to claim 1, wherein the fourth node is connected to the fifth node.

3. The pixel driving circuit according to claim 1, wherein the driving circuit comprises:

a driving transistor, having a first terminal connected to the second node, a second terminal connected to the third node, and a gate connected to the first node;

the compensation circuit comprises:

a second transistor, having a first terminal connected to the fourth node, a second terminal connected to the third node, and a gate connected to the first gate driving signal end;

the first reset circuit comprises:

a first transistor, having a first terminal connected to the first initial signal end, a second terminal connected to the fifth node, and a gate connected to the first reset signal end;

the first isolation circuit comprises:

a ninth transistor, having a first terminal connected to the first node and a second terminal connected to the fourth node; and the second isolation circuit comprises:

an eighth transistor, having a first terminal connected to the first node and a second terminal connected to the fifth node.

4. The pixel driving circuit according to claim 3, wherein any one of the first transistor, the second transistor, the eighth transistor, and the ninth transistor is an N-type transistor or a P-type transistor.

5. The pixel driving circuit according to claim 1, wherein the pixel driving circuit is configured to drive a light emitting unit to emit light, and the pixel driving circuit further comprises:

a light emitting control circuit, connecting a first power supply end, the second node, the third node, an enable signal end, and a first electrode of the light emitting unit, wherein the light emitting control circuit is configured to connect the first power supply end and the second node and connect the third node and the first electrode of the light emitting unit in response to a signal of the enable signal end;

a second reset circuit, connecting the first electrode of the light emitting unit, a second initial signal end, and a second reset signal end, wherein the second reset circuit is configured to transmit a signal of the second initial signal end to the first electrode of the light emitting unit in response to a signal of the second reset signal end;

a data writing circuit, connecting the second node, a data signal end, and a second gate driving signal end, wherein the data writing circuit is configured to transmit a signal of the data signal end to the second node in response to a signal of the second gate driving signal end; and a storage circuit, connected between the first node and the first power supply end.

6. The pixel driving circuit according to claim 5, wherein the data writing circuit comprises:

a fourth transistor, having a first terminal connected to the data signal end, a second terminal connected to the second node, and a gate connected to the second gate driving signal end;

the light emitting control circuit comprises:

a fifth transistor, having a first terminal connected to the first power supply end, a second terminal connected to the second node, and a gate connected to the enable signal end; and a sixth transistor, having a first terminal connected to the third node, a second terminal connected to the first electrode of the light emitting unit, and a gate connected to the enable signal end;

the second reset circuit comprises:

a seventh transistor, having a first terminal connected to the second initial signal end, a second terminal connected to the first electrode of the light emitting unit, and a gate connected to the second reset signal end; and the storage circuit comprises:

a capacitor, having a first electrode connected to the first node and a second electrode connected to the first power supply end.

7. The pixel driving circuit according to claim 5, wherein the first isolation circuit and the data writing circuit have a same conduction level logic, the first isolation circuit is connected to the second gate driving signal end, and the first isolation circuit is configured to conduct the first node and the fourth node in response to the signal of the second gate driving signal end.

8. A driving method for driving the pixel driving circuit according to claim 1, comprising:

in a reset phase, transmitting the signal of the first initial signal end to the fifth node by using the first reset circuit, and conducting the fifth node and the first node by using the second isolation circuit;

in a data writing phase, conducting the fourth node and the third node by using the compensation circuit, and conducting the fourth node and the first node by using the first isolation circuit; and in a light emitting phase, disconnecting the first initial signal end and the fifth node by using the first reset circuit, disconnecting the fifth node and the first node by using the second isolation circuit, disconnecting the fourth node and the third node by using the compensation circuit, and disconnecting the fourth node and the first node by using the first isolation circuit.

9. A display panel, comprising a pixel driving circuit, wherein the pixel driving circuit comprises:

a driving circuit, connecting a first node, a second node, and a third node, and configured to provide, based on a voltage of the first node, a driving current to the third node by using the second node;

a compensation circuit, connecting the third node, a fourth node, and a first gate driving signal end, and configured to conduct the third node and the fourth node in response to a signal of the first gate driving signal end;

a first reset circuit, connecting a first initial signal end, a fifth node, and a first reset signal end, and configured to transmit a signal of the first initial signal end to the fifth node in response to a signal of the first reset signal end;

a first isolation circuit, connecting the first node and the fourth node, and configured to conduct the first node and the fourth node in response to a control signal, wherein the control signal of the first isolation circuit is different from the signal of the first gate driving signal end; and a second isolation circuit, connecting the first node and the fifth node, and configured to conduct the first node and the fifth node in response to another control signal, wherein the another control signal of the second isolation circuit is different from the signal of the first reset signal end.

10. A display device, comprising the display panel of claim 9.

11. A display panel, comprising a pixel driving circuit, wherein the pixel driving circuit comprises:
a driving transistor;
an eighth transistor, having a first terminal connected to a gate of the driving transistor and a gate connected to a third reset signal line;
a ninth transistor, having a first terminal connected to the gate of the driving transistor and a gate connected to a second gate line;
a first transistor, having a first terminal connected to a first initial signal line, a second terminal connected to a second terminal of the eighth transistor, and a gate connected to a first reset signal line; and
a second transistor, having a first terminal connected to a second terminal of the ninth transistor, a second terminal connected to a second terminal of the driving transistor, and a gate connected to a first gate line; and the display panel further comprises:
a substrate;
a first active layer, comprising a third active portion, an eighth active portion, and a ninth active portion, wherein the third active portion is used for forming a channel region of the driving transistor, the eighth active portion is used for forming a channel region of the eighth transistor, and the ninth active portion is used for forming a channel region of the ninth transistor;
a first conductive layer, located at a side of the first active layer away from the substrate, wherein the first conductive layer comprises: the third reset signal line, the second gate line, and a first conductive portion, an orthographic projection of the third reset signal line on the substrate covers an orthographic projection of the eighth active portion on the substrate, a partial structure of the third reset signal line is used for forming the gate of the eighth transistor, an orthographic projection of the second gate line on the substrate covers an orthographic projection of the ninth active portion on the substrate, a partial structure of the second gate line is used for forming the gate of the ninth transistor, an orthographic projection of the first conductive portion on the substrate covers an orthographic projection of the third active portion on the substrate, and the first conductive portion is used for forming the gate of the driving transistor;
a second active layer, located at a side of the first conductive layer away from the substrate, wherein the second active layer comprises a first active portion and a second active portion, the first active portion is used for forming a channel region of the first transistor, and the second active portion is used for forming a channel region of the second transistor; and a third conductive layer, located at a side of the second active layer away from the substrate, wherein the third conductive layer comprises the first reset signal line and the first gate line, an orthographic projection of the first reset signal line on the substrate covers an orthographic projection of the first active portion on the substrate, a partial structure of the first reset signal line is used for forming a top gate of the first transistor, an orthographic projection of the first gate line on the substrate covers an orthographic projection of the second active portion on the substrate, and a partial structure of the first gate line is used for forming a top gate of the second transistor.

12. The display panel according to claim 11, wherein the orthographic projection of the third reset signal line on the substrate, the orthographic projection of the second gate line on the substrate, the orthographic projection of the first reset signal line on the substrate, and the orthographic projection of the first gate line on the substrate extend along a first direction;

the orthographic projection of the first gate line on the substrate is located between the orthographic projection of the first conductive portion on the substrate and the orthographic projection of the second gate line on the substrate;

the orthographic projection of the third reset signal line on the substrate is located at a side of the orthographic projection of the second gate line on the substrate away from the orthographic projection of the first conductive portion on the substrate; and the orthographic projection of the first reset signal line on the substrate is located at a side of the orthographic projection of the third reset signal line on the substrate away from the orthographic projection of the first conductive portion on the substrate.

13. The display panel according to claim 12, further comprising a light emitting unit, wherein the pixel driving circuit further comprises a fifth transistor and a seventh transistor; wherein a first terminal of the fifth transistor is connected to a power supply line, a second terminal of the fifth transistor is connected to a first terminal of the driving transistor, a first terminal of the seventh transistor is connected to a second initial signal line, and a second terminal of the seventh transistor is connected to a first electrode of the light emitting unit;

the first active layer further comprises:
a fifth active portion, used for forming a channel region of the fifth transistor; and
a seventh active portion, used for forming a channel region of the seventh transistor;

the first conductive layer further comprises:
an enable signal line, wherein an orthographic projection of the enable signal line on the substrate extends along the first direction and covers an orthographic projection of the fifth active portion on the substrate, and a partial structure of the enable signal line is used for forming a gate of the fifth transistor; and a second reset signal line, wherein an orthographic projection of the second reset signal line on the substrate extends along the first direction and covers an orthographic projection of the seventh active portion on the substrate, and a partial structure of the second reset signal line is used for forming a gate of the seventh transistor; wherein the orthographic projection of the enable signal line on the substrate is located at a side of the orthographic projection of the first conductive portion on the substrate away from the orthographic projection of the first gate line on the substrate; and the orthographic projection of the second reset signal line on the substrate is located at a side of the orthographic projection of the enable signal line on the substrate away from the orthographic projection of the first conductive portion on the substrate.

14. The display panel according to claim 13, comprising a plurality of pixel driving circuits distributed in an array along a row direction and a column direction, wherein the first direction is the row direction, and the second reset signal line in the pixel driving circuits of one row is multiplexed as the third reset signal line in the pixel driving circuits of one adjacent row.

15. The display panel according to claim 13, comprising a plurality of pixel driving circuits distributed in an array along a row direction and a column direction, wherein the first direction is the row direction, and the orthographic projection of the first initial signal line, in the pixel driving circuits of one row, on the substrate, is located between the orthographic projection of the second reset signal line, in the pixel driving circuits of one adjacent row, on the substrate, and the orthographic projection of the enable signal line, in the pixel driving circuits of the adjacent row, on the substrate.

16. The display panel according to claim 13, further comprising:
a fourth conductive layer, located at a side of the third conductive layer away from the substrate, wherein the fourth conductive layer comprises the second initial signal line, an orthographic projection of the second initial signal line extends along a second direction on the substrate, and the second direction intersects with the first direction.

17. The display panel according to claim 16, wherein the pixel driving circuit further comprises a fourth transistor, wherein a first terminal of the fourth transistor is connected to a data line, a second terminal of the fourth transistor is connected to the first terminal of the driving transistor; and the display panel further comprises:
a fifth conductive layer, located at a side of the fourth conductive layer away from the substrate, wherein the fifth conductive layer comprises the data line and the power supply line, and an orthographic projection of the data line on the substrate and an orthographic projection of the power supply line on the substrate extend along the second direction; and
a plurality of repeating cells, distributed in an array along the first direction and the second direction, wherein each repeating cell comprises two pixel driving circuits distributed along the first direction and arranged in mirror symmetry; wherein
the second direction is the column direction, and each column of the pixel driving circuits is provided with one power supply line and one data line correspondingly; and
in two pixel driving circuits adjacent to each other in the first direction and located in different repeating cells, orthographic projections of two data lines on the substrate are located between orthographic projections of two power supply lines on the substrate, and the orthographic projection of the second initial signal line on the substrate is located between the orthographic projections of the two data lines on the substrate.

18. The display panel according to claim 17, wherein two pixel driving circuits adjacent to each other in the first direction and located in different repeating cells are provided with one second initial signal line correspondingly, and the second initial signal line is connected to the first terminal of the seventh transistor in each of the corresponding two pixel driving circuits, respectively.

19. The display panel according to claim 11, comprising a plurality of repeating cells distributed in an array along a first direction and a second direction, wherein the first direction intersects with the second direction;
each repeating cell comprises two pixel driving circuits distributed along the first direction and arranged in mirror symmetry;
the pixel driving circuit further comprises a capacitor, wherein a first electrode of the capacitor is connected to the gate of the driving transistor, and a second electrode of the capacitor is connected to a power supply line; and
the first direction is a row direction, the second direction is a column direction, and the display panel further comprises:
a second conductive layer, located between the first conductive layer and the second active layer, wherein the second conductive layer comprises a second conductive portion, an orthographic projection of the second conductive portion on the substrate and the orthographic projection of the first conductive portion on the substrate at least partially overlap, the first conductive portion is multiplexed as the first electrode of the capacitor, and the second conductive portion is used for forming the second electrode of the capacitor; and
a fifth conductive layer, located at a side of the third conductive layer away from the substrate, wherein the fifth conductive layer comprises the power supply line, each column of the pixel driving circuits is provided with one power supply line correspondingly, and the power supply line comprises: a first extension portion, a second extension portion, and a third extension portion, wherein the second extension portion is connected between the first extension portion and the third extension portion; wherein
an orthographic projection of the second extension portion on the substrate has a larger size in the row direction than an orthographic projection of the first extension portion on the substrate, and the orthographic projection of the second extension portion on the substrate has a larger size in the row direction than an orthographic projection of the third extension portion on the substrate; and
second extension portions in two adjacent power supply lines in the same repeating cell are connected to each other, and two adjacent second conductive portions in two repeating cells adjacent to each other in the row direction are connected to each other.

20. The display panel according to claim 11, further comprising a light emitting unit, wherein the pixel driving circuit further comprises: a fourth transistor, a fifth transistor, a sixth transistor, a seventh transistor, and a capacitor; wherein
a first terminal of the fourth transistor is connected to a data line, and a second terminal of the fourth transistor is connected to a first terminal of the driving transistor;

a first terminal of the fifth transistor is connected to a power supply line, and a second terminal of the fifth transistor is connected to the first terminal of the driving transistor;

a first terminal of the sixth transistor is connected to the second terminal of the driving transistor, and a second terminal of the sixth transistor is connected to a first electrode of the light emitting unit;

a first terminal of the seventh transistor is connected to a second initial signal line, and a second terminal of the seventh transistor is connected to the first electrode of the light emitting unit;

a first electrode of the capacitor is connected to the gate of the driving transistor, and a second electrode of the capacitor is connected to the power supply line; and the first transistor and the second transistor are N-type transistors, and the driving transistor, the fourth transistor, the fifth transistor, the sixth transistor, the seventh transistor, the eighth transistor, and the ninth transistor are P-type transistors.

\* \* \* \* \*